(12) United States Patent
Han et al.

(10) Patent No.: US 12,733,104 B2
(45) Date of Patent: Sep. 8, 2026

(54) APPARATUS AND METHOD OF MANUFACTURING A DISPLAY DEVICE

(71) Applicant: SAMSUNG DISPLAY CO., LTD., Yongin-si (KR)

(72) Inventors: Sooyeon Han, Yongin-si (KR); Chanjae Park, Yongin-si (KR); Kichun Song, Yongin-si (KR); Chelgou Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1043 days.

(21) Appl. No.: 17/536,184

(22) Filed: Nov. 29, 2021

(65) Prior Publication Data

US 2022/0367531 A1 Nov. 17, 2022

(30) Foreign Application Priority Data

May 11, 2021 (KR) ........................ 10-2021-0060810

(51) Int. Cl.
*B23K 20/10* (2006.01)
*H05K 1/189* (2026.01)
(Continued)

(52) U.S. Cl.
CPC ........... *H05K 1/189* (2013.01); *B23K 20/106* (2013.01); *H10D 86/021* (2025.01); *H10K 71/00* (2023.02)

(58) Field of Classification Search
CPC ................... H05K 3/328; H05K 1/189; H05K 2201/10128; G02F 1/1303; H10D 86/021; H10K 71/00
See application file for complete search history.

(56) References Cited

U.S. PATENT DOCUMENTS 3,526,792 A * 9/1970 Shoh ........................ B08B 3/123 310/316.01
3,529,660 A * 9/1970 Obeda ................. B29C 66/8167 165/47
(Continued)

FOREIGN PATENT DOCUMENTS

DE 10250741 A1 * 5/2004 ............... B06B 3/02
GB 2000470 A * 1/1979 ............ B29C 65/08
(Continued)

OTHER PUBLICATIONS

Adamek, "Components Of An Ultrasonic Welding System", https://blog.xfurth.com/blog/components-of-an-ultrasonic-welding-system , Aug. 28, 2017 (Year: 2017).*
(Continued)

*Primary Examiner* — Keith Walker
*Assistant Examiner* — Carlos J Gamino
(74) *Attorney, Agent, or Firm* — F. CHAU & ASSOCIATES, LLC

(57) ABSTRACT

An apparatus for manufacturing a display device, the apparatus including: a head portion configured to fix a driving chip; a heater portion coupled to the head portion; a booster portion connected to the head portion; a converter portion connected to the booster portion and configured to vibrate the head portion; and a cooling portion arranged at the converter portion or the booster portion and configured to cool the converter portion or the booster portion by supplying a gas to the converter portion or the booster portion.

16 Claims, 14 Drawing Sheets

(51) Int. Cl.

| | |
|---|---|
| *H10D 86/01* | (2025.01) |
| *H10K 71/00* | (2023.01) |

(56) References Cited

U.S. PATENT DOCUMENTS

| | | | | |
|---|---|---|---|---|
| 5,667,130 | A * | 9/1997 | Morita | H01L 24/78 228/110.1 |
| 5,730,832 | A | 3/1998 | Sato et al. | |
| 7,850,056 | B2 * | 12/2010 | Nasu | H01L 24/81 228/110.1 |
| 8,028,886 | B2 | 10/2011 | Ebihara et al. | |
| 8,328,066 | B2 | 12/2012 | Fujita et al. | |
| 9,113,586 | B2 | 8/2015 | Lee et al. | |
| 9,780,066 | B2 * | 10/2017 | Wasserman | B32B 37/06 |
| 10,525,634 | B2 * | 1/2020 | Vila Noria | B23K 20/10 |
| 10,923,453 | B2 * | 2/2021 | Kim | G02F 1/1303 |
| 11,135,779 | B2 | 10/2021 | Lee et al. | |
| 12,042,878 | B2 * | 7/2024 | Brown | B29C 65/08 |
| 2002/0066767 | A1 * | 6/2002 | Takahashi | H01L 24/75 228/110.1 |
| 2002/0115278 | A1 * | 8/2002 | Kawai | H01L 21/563 257/E21.511 |
| 2004/0190733 | A1 * | 9/2004 | Nayar | B22D 19/14 381/98 |
| 2005/0227429 | A1 * | 10/2005 | Minamitani | H01L 24/81 438/222 |
| 2009/0265924 | A1 * | 10/2009 | Ebihara | H05K 13/046 29/739 |
| 2010/0065613 | A1 | 3/2010 | Nasu et al. | |
| 2010/0147466 | A1 * | 6/2010 | Sans Marimon | B29C 66/8167 156/580.2 |
| 2010/0219229 | A1 | 9/2010 | Fujita et al. | |
| 2019/0198476 | A1 | 6/2019 | Kim et al. | |
| 2020/0006397 | A1 * | 1/2020 | Park | H10D 86/443 |
| 2020/0090559 | A1 * | 3/2020 | Song | H10K 77/111 |
| 2021/0202125 | A1 * | 7/2021 | Nakatsugawa | A61B 6/44 |
| 2024/0145428 | A1 * | 5/2024 | Terahata | H01L 24/11 |

FOREIGN PATENT DOCUMENTS

| | | | | |
|---|---|---|---|---|
| JP | 04267130 | A * | 9/1992 | B29C 65/087 |
| JP | 2006-093168 | A2 | 4/2006 | |
| JP | 4884936 | | 2/2012 | |
| JP | 6349502 | | 7/2018 | |
| JP | 2019181508 | A * | 10/2019 | |
| KR | 10-0342663 | | 11/2002 | |
| KR | 10-0936781 | | 1/2010 | |
| KR | 10-0950980 | | 3/2010 | |
| KR | 10-2010-0066382 | A | 6/2010 | |
| KR | 10-2010-0099051 | A | 9/2010 | |
| KR | 10-1135335 | | 4/2012 | |
| KR | 10-1417252 | | 7/2014 | |
| KR | 10-2021-0038760 | A | 4/2021 | |
| WO | WO-2019070846 | A1 * | 4/2019 | |

OTHER PUBLICATIONS

Zhang et al. "Harmonic excitation response performance and active regulation of the high-frequency piezoelectric ultrasonic transducer used in the thermosonic bonding for microelectronics", Sensors and Actuators A: Physical vol. 304, Apr. 1, 2020, 111839, pp. 1-13.

Joo et al., "Development of bonding process for flexible devices with fine-pitch interconnection using Anisotropic Solder Paste and Laser-Assisted Bonding Technology", 2020 IEEE 70th Electronic Components and Technology Conference (ECTC), pp. 1309-1314.

Roshanghias et al., "Thermosonic fine-pitch flipchip bonding of silicon chips on screen printed paper and PET substrates", Microelectronic Engineering, vol. 228, May 1, 2020, 111330, pp. 1-7.

"Customized Ultrasonic Welding Horn Titanium_ Aluminum Steel Amplitude Boosters", 6 pages.

"Plastic Welding Technologies for Medical Device Design and Assembly", 2017, pp. 1-15.

"Single wavelength rigid head", 1 page.

"Ultrasonic Welding Machine Horn with Different Types Plastic Welding Head", 22 pages.

"Debut of Flip Chip Bonding system that meets the needs of your production", 2 pages.

Office Action dated May 9, 2026 in related Chinese Patent Application No. 202210511031.8, 13 pages, in Chinese.

* cited by examiner

APPARATUS AND METHOD OF MANUFACTURING A DISPLAY DEVICE

CROSS-REFERENCE TO RELATED APPLICATION

This application claims priority under 8b U.S.C. § 119 to Korean Patent Application No. 10-2021-0060810, filed on May 11, 2021, in the Korean Intellectual Property Office, the disclosure of which is incorporated by reference herein in its entirety.

TECHNICAL FIELD

One or more embodiments of the disclosure relate to an apparatus and method of manufacturing a display device.

DESCRIPTION OF THE RELATED ART

Mobility-based electronic devices are widely used. As mobile electronic devices, in addition to small electronic devices such as mobile phones, tablet personal computers (PCs) are widely used.

In order to support various functions, such a mobile electronic device includes a display device to provide visual information such as images or videos to a user. As the components for driving a display device continue to shrink, the proportion of the display device in electronic devices is gradually increasing. In other words, the size of the display device relative to its electronic device has increased. Furthermore, a display device with a structure that is bendable from a flat state to have a certain angle has been developed.

SUMMARY

Generally, a display device may include a display panel on which various driving chips are arranged. In this regard, ultrasound may be used to fix a driving chip on a display panel. When the display panel is fixed on the driving chip by using ultrasound only, the driving chip may be detached from the display panel. Heat may be used to address the issue. However, when heat is used, an operating range of an ultrasound generation apparatus is changed, and thus, the driving chip may not be fixed on the display panel. One or more embodiments of the disclosure include an apparatus and method of manufacturing a display device, which may firmly fix a driving chip on a display panel.

According to one or more embodiments of the disclosure, there is provided an apparatus for manufacturing a display device, the apparatus including: a head portion configured to fix a driving chip; a heater portion coupled to the head portion; a booster portion connected to the head portion; a converter portion connected to the booster portion and configured to vibrate the head portion; and a cooling portion arranged at the converter portion or the booster portion and configured to cool the converter portion or the booster portion by supplying a gas to the converter portion or the booster portion.

The heater portion may penetrate the head portion.

The head portion may include a fixing portion configured to fix the driving chip.

The apparatus may further include a temperature detection portion arranged at the head portion or the converter portion.

The head portion may include: a head body portion; a neck portion connected to the head body portion; and a tip portion arranged at an end portion of the neck portion.

The heater portion may be arranged at the neck portion.

The cooling portion may cool an outside of the converter portion or the booster portion.

The cooling portion may include: a first inlet arranged at an outer surface of the booster portion and through which a gas is introduced; a first flow path in communication with the first inlet and penetrating the booster portion; and a first outlet arranged apart from the first inlet, connected to the first flow path, and through which the gas is discharged.

The cooling portion may include a second flow path portion penetrating the converter portion and in communication with the first flow path portion.

The cooling portion may include a cooling pocket around an outer surface of the booster portion or the converter portion, and configured to cool the booster portion or the converter portion with external air introduced into the booster portion or the converter portion.

The apparatus may further include a first stage facing the head portion and on which a display panel to which the driving chip is bonded is placed.

The apparatus may further include a second stage arranged apart from the first stage and configured to support the driving chip.

According to one or more embodiments of the disclosure, there is provided a method of manufacturing a display device, the method including: arranging a display panel on a first stage; arranging a head portion connected to a booster portion, such that a driving chip corresponds to a pad of the display panel; bonding the driving chip to the pad of the display panel by applying heat to the head portion and vibrating the head portion; and blocking the heat of the head portion from moving toward the booster portion, by supplying a gas to the booster portion.

The head portion may be vibrated by a converter portion connected to the booster portion.

The method may further include cooling an inside of the converter portion.

The method may further include cooling an outside of the converter portion or the booster portion.

A gas introduced into the booster portion may be moved through an inside of the booster portion or the converter portion and discharged to an outside of the booster portion or the converter portion. In this case, the method may further include moving the gas along an outer surface of the booster portion or an outer surface of the converter portion.

The method may further include arranging a film member between the driving chip and the display panel.

The method may further include cooling the booster portion.

The method may further include heating the head portion.

According to one or more embodiments of the disclosure, there is provided a method of manufacturing a display device, the method including: arranging a display panel on a first stage; arranging a head portion such that a driving chip corresponds to a pad of the display panel; bonding the driving chip to the pad of the display panel by applying heat to the head portion and vibrating the head portion by using a converter portion connected to the head portion via a booster portion; and cooling the booster portion or the converter portion by supplying a gas to an inner surface of the booster portion or the converter portion.

The gas may move along a flow path of the inner surface of the booster portion or the converter portion to cool the booster portion or the converter portion.

The method may further include cooling the booster portion or the converter portion by supplying the gas to an outer surface of the booster portion or the converter portion.

The method may further include surrounding an outer surface of the booster portion or the converter portion with a cooling pocket.

The gas may be moved from an outer surface of the cooling pocket to the inner surface of the booster portion, and then to the inner surface of the booster portion or the converter portion and to an outer surface of the booster portion or the converter portion.

The cooling pocket may be in contact with a nodal point arranged at the booster portion or the converter portion.

The method may further include heating the head portion through a heater portion arranged in the head portion.

The method may further include fixing the driving chip on a tip portion protruding from the head portion.

The method may further include arranging the driving chip on a second stage.

The method may further include transferring the driving chip on the second stage to the head portion.

According to one or more embodiments of the disclosure, there is provided an apparatus for manufacturing a display device, the apparatus including: a head portion configured to fix a driving chip; a heater portion coupled to the head portion; a converter portion connected to the head portion and configured to vibrate the head portion; and a cooling portion arranged at the converter portion and configured to cool the converter portion by supplying a gas to the converter portion.

The cooling portion may be disposed at opposite sides of the converter portion.

A space may be provided between the cooling portion and the converter portion to accommodate the gas.

The apparatus may further include a booster portion connected to the converter portion.

The cooling portion may be disposed at opposite sides of the booster portion.

The cooling portion may cool the booster portion.

These embodiments can be implemented using a system, a method, a computer program, or any combination of a system, a method, and a computer program.

BRIEF DESCRIPTION OF THE DRAWINGS

The above and other features of certain embodiments of the disclosure will be more apparent from the following description taken in conjunction with the accompanying drawings, in which.

DETAILED DESCRIPTION OF THE EMBODIMENTS

Figure 1:
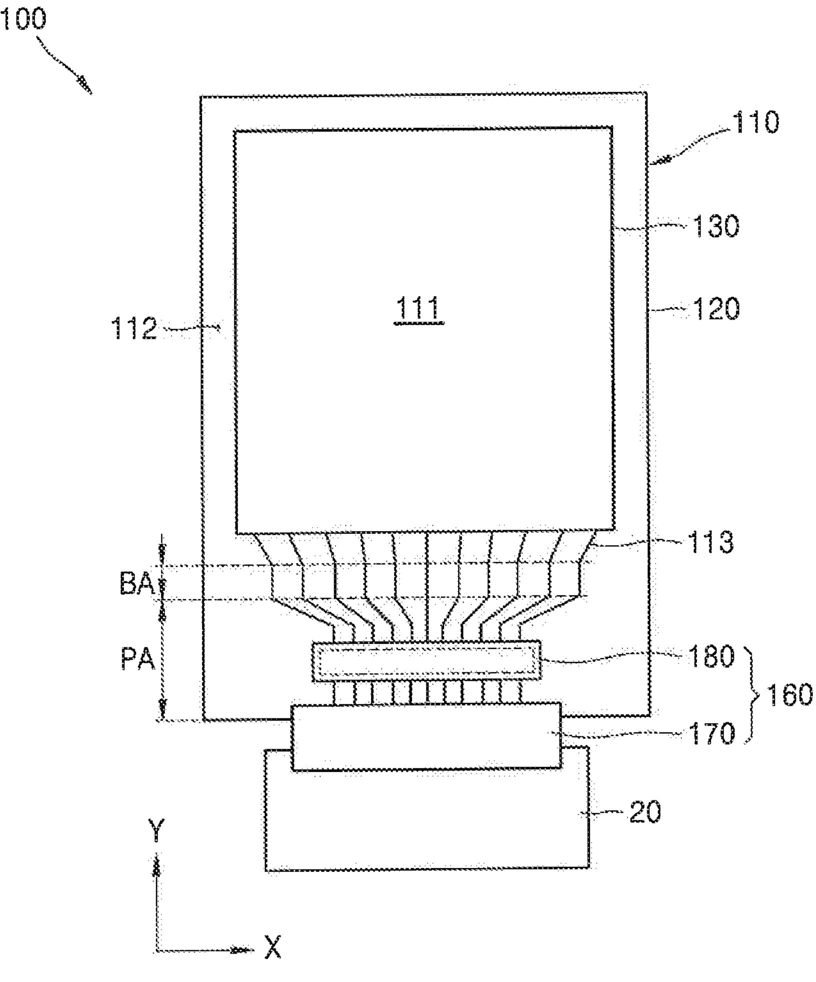
FIG. 1 is a plan view of a display device according to one or more embodiments of the disclosure.

Embodiments of the disclosure will now be described with reference to the accompanying drawings. The disclosure may, however, be embodied in many different forms and should not be construed as being limited to the descriptions set forth herein. As used herein, the term "and/or" may include any and all combinations of one or more of the associated listed items. Throughout the disclosure, the expression "at least one of a, b or c" may indicate only a, only b, only c, both a and b, both a and c, both b and c, all of a, b, and c, or variations thereof.

Like reference numerals may refer to like elements throughout this disclosure.

In the embodiments below, it will be understood that although the terms "first," "second," etc. may be used to describe various components, those components should not be limited by these terms.

In the embodiments below, the singular forms "a," "an" and "the" are intended to include the plural forms as well, unless the context clearly indicates otherwise.

In the embodiments below, when a part may "include" or "have" a certain constituent element, unless specified otherwise, it may not be construed to exclude another constituent element but may be construed to further include other constituent elements.

In the embodiments below, it will be understood that when a layer, region, or component is referred to as being "formed on" another layer, region, or component, it can be directly or indirectly formed on the other layer, region, or component. In other words, for example, intervening layers, regions, or components may be present.

Sizes of components in the drawings may be exaggerated for convenience of explanation.

In the following embodiments, the x-axis, the y-axis and the z-axis are not limited to three axes of the rectangular coordinate system. For example, the x-axis, the y-axis, and the z-axis may be perpendicular to one another, or may represent different directions that are not perpendicular to one another.

When a certain embodiment can be implemented differently, a specific process order may be performed differently from the described order. For example, two consecutively described processes may be performed at substantially the same time or performed in an order opposite to the described order.

Figure 2:
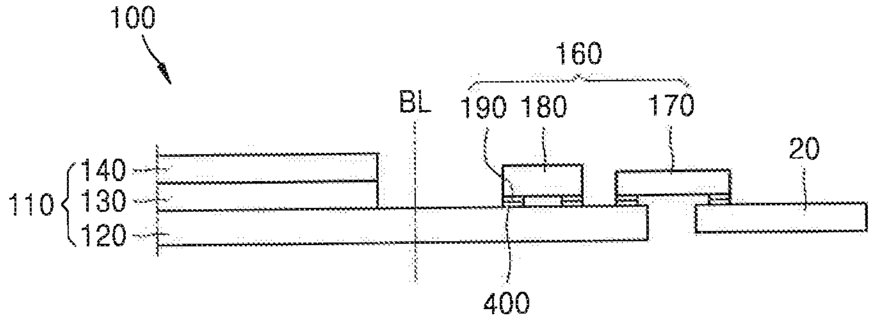
FIG. 2 is a front view of part of the display device of FIG. 1.
Figure 3:
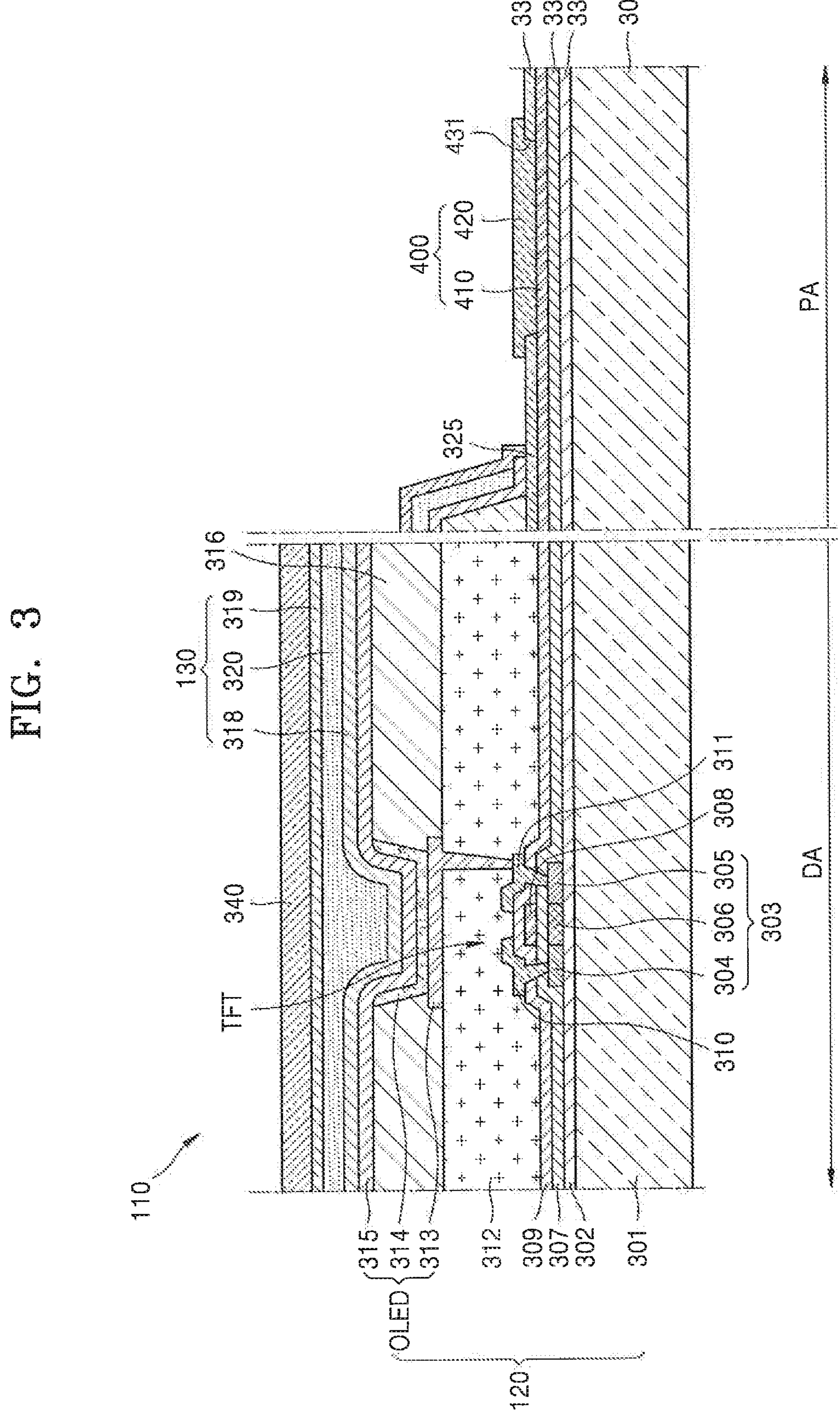
FIG. 3 is a cross-sectional view of part of the display device of FIG. 1.

FIG. 1 is a plan view of a display device 100 according to one or more embodiments of the disclosure. FIG. 2 is a front view of a part of the display device 100 of FIG. 1. FIG. 3 is a cross-sectional view of the part of the display device 100 of FIG. 1.

Referring to FIGS. 1 to 3, the display device 100 may include a display panel 110. In an embodiment of the disclosure, the display device 100 may be an organic light-emitting display device (OLED). However, the display device 100 is not limited thereto, and may include, in addition to an organic light-emitting display apparatus, an inorganic light-emitting (EL) display apparatus, a quantum-dot light-emitting display apparatus, a field emission display apparatus, a surface-conduction electron-emitter display apparatus, a plasma display apparatus, etc.

The display panel 110 may include a display substrate 120 including a plurality of devices, and a thin film encapsulation (TFE) layer 130 arranged on the display substrate 120. A plurality of thin film transistors (TFTs) and a plurality of light-emitting devices respectively connected to TFTs may be arranged on the display substrate 120. A functional film 140 such as a polarized plate, a touch screen, or a cover window may be arranged on the TFE layer 130.

A display area 111 for display an image and a peripheral area 112 extending to the outside of the display area 111 may be arranged on the display panel 110. In this state, no image may be displayed in the peripheral area 112.

The TFE layer 130 may cover the display area 111.

The peripheral area 112 may surround the display area 111. The peripheral area 112 may also be disposed on less than all sides of the display area 111. In an embodiment of the disclosure, a bending area BA in which the display panel 110 is bendable in one direction and a pad area PA extending to the outside of the bending area BA may be arranged in the peripheral area 112. However, one or more embodiments of the disclosure, are not limited thereto, and the bending area BA may be formed in the display area 111. In another embodiment of the disclosure, the peripheral area 112 may extend to the pad area PA with no bending area BA. However, in the following description, for convenience of explanation, a case in which the peripheral area 112 includes the bending area BA and the pad area PA is mainly described.

The bending area BA may have various shapes. In an embodiment of the disclosure, the bending area BA may have, as illustrated in FIG. 1, the same width as the display area 111 and the peripheral area 112, which is measured, for example, in the X-axis direction of FIG. 1. In another embodiment of the disclosure, the width of the bending area BA may decrease further away from the display area 111. Furthermore, the width of the bending area BA may be constant at a certain distance in a portion of the bending area BA connected to the display area 111. In this case, the edge of a side surface of the bending area BA may have a round shape.

The display panel 110 may be bent in one direction around a bending line BL (see FIG. 2) that is a reference line arranged in the bending area BA. In this state, the bending line BL may be arranged in the X-axis direction of FIG. 1 in the bending area BA with respect to FIG. 1. However, the disclosure is not limited thereto, and the display area 111 and the pad area PA may be connected to each other without the bending area BA. In other words, the display panel 110 may be formed to be rigid without the bending line BL. However, in the following description, for convenience of explanation, the display panel 110 that is configured to be bent in one direction with respect to the bending line BL is mainly described.

The pad area PA may be arranged at one edge of the display substrate 120. A plurality of pad terminals 400 may be arranged in the pad area. PA. The pad terminals 400 may be arranged apart from each other in the X-axis and Y-axis directions of the display substrate 120. The pad terminals 400 may be connected to a plurality of wirings 113 extending from the display area 111. The wirings 113 may extend in the Y-axis direction of the display substrate 120.

The pad terminals 400 may be electrically connected to a driving portion 160.

The driving portion 160 may include a driving circuit, and may be a chip on plastic (COP). However, the driving portion 160 is not limited thereto, and for example, the driving portion 160 may be a chip on film (COF) or a chip on glass (COG).

The driving portion 160 may include a flexible film 170 on which circuit wirings are patterned, a driving chip 180 arranged on the display substrate 120, and a plurality of driving terminals 190 arranged below the driving chip 180. The driving chip 180 may be connected to the display substrate 120 via the driving terminals 190. The flexible film 170 may be electrically connected to the driving chip 180.

The flexible film 170 may be electrically connected to a circuit board 20. The circuit board 20 may be a flexible printed circuit board (FPCB).

The pad terminals 400 may be electrically connected the driving terminals 190. In other words, the pad terminals 400 and the driving terminals 190, which are arranged respectively corresponding to each other, may be directly and electrically connected to each other. In this state, the driving chip 180 may be connected to the pad terminals 400.

For example, at least one of the pad terminals 400 and at least one of the driving terminals 190 may be connected to each other. The pad terminals 400 and the driving terminals 190, which are layers formed in a combination process through ultrasonic bonding, may be formed in a process in which some of the pad terminals 400 and some of the driving terminals 190, which are adjacent to each other, diffuse to each other to be combined with each other, during the ultrasonic bonding process.

A display area DA provided in the display area 111 and the pad area PA provided in the peripheral area 112 may be arranged on a display substrate 301.

The display substrate 301 may be a flexible glass substrate, a flexible polymer substrate, a rigid glass substrate, or a rigid polymer substrate. The display substrate 301 may be transparent, semi-transparent, or opaque.

A barrier film 302 may be arranged on the display substrate 301. The barrier film 302 may cover an upper surface of the display substrate 301. The barrier film 302 may be an organic film or an inorganic film. The barrier film 302 may be a single film or a multilayer film.

At least one TFT may be arranged in the display area DA. In an embodiment of the disclosure, the number of TFTs is not limited.

A semiconductor active layer 303 may be arranged on the barrier film 302. The semiconductor active layer 303 may include a source region 304 and a drain region 305, which are arranged by doping N-type impurities ions or P-type impurities ions. A space between the source region 304 and the drain region 305 is a channel region 306 where no impurities are doped. The semiconductor active layer 303 may include an organic semiconductor, an inorganic semiconductor, or an amorphous silicon. In another embodiment of the disclosure, the semiconductor active layer 303 may include an oxide semiconductor.

A gate insulating film 307 may be deposited on the semiconductor active layer 303. The gate insulating film 307 may be an organic film and/or an inorganic film. Furthermore, the gate insulating film 307 may be a single film or a multilayer film including at least one of an organic film or an inorganic film. In this state, the gate insulating film 307 is not limited thereto, and may be modified into various forms.

A gate electrode 308 may be arranged on the gate insulating film 307. The gate electrode 308 may include a conductive metal material. For example, the gate electrode 308 may include at least one of molybdenum (Mo), aluminum (Al), copper (Cu), or titanium (Ti). The gate electrode 308 may be a single film and/or a multilayer film including at least one of Ma, Al, Cu, or Ti. In this state, the gate electrode 308 is not limited thereto, and may be modified into various forms with various materials.

An interlayer insulating film 309 may be arranged on the gate electrode 308. The interlayer insulating film 309 may be an organic film or an inorganic film.

A source electrode 310 and a drain electrode 311 may be arranged on the interlayer insulating film 309. A contact hole may be formed by removing a part of the gate insulating film 307 and a part of the interlayer insulating film 309, the source electrode 310 may be electrically connected to the source region 304 through a first contact hole, and the drain electrode 311 may be electrically connected to the drain region 305 through a second contact hole.

The source electrode 310 and the drain electrode 311 each may include a metal material exhibiting excellent conductivity. In other words, the source electrode 310 and the drain electrode 311 each may include at least one of Mo, Al, Cu, or Ti. The source electrode 310 and the drain electrode 311 each may be a single film or a multilayer film including at least one of Ma, Al, Cu, or Ti. For example, the source electrode 310 and the drain electrode 311 each may have a stack structure of Ti/Al/Ti. In this state, at least one of the source electrode 310 and the drain electrode 311 is not limited thereto, and may include various materials and may be formed in various structures.

A protective film 312 may be arranged on the source electrode 310 and the drain electrode 311. The protective film 312 may be an organic film or an inorganic film. The protective film 312 may be a passivation film or a planarized film. Any one of the passivation film and the planarized film may be omitted.

The TFT may be electrically connected to the OLED. For example, the drain electrode 311 of the TFT may be connected to the OLED through a contact hole formed in the protective film 312.

The OLED may be arranged on the protective film 312. The OLED may include a first electrode 313, an intermediate layer 314, and a second electrode 315.

The first electrode 313 may function as an anode electrode, and include various conductive materials. The first electrode 313 may include a transparent electrode or a reflective electrode. In other words, when the first electrode 313 is used as a transparent electrode, the first electrode 313 may include a transparent conductive film. When the first electrode 313 is used as a reflective electrode, the first electrode 313 may include a reflective film and a transparent conductive film arranged on the reflective film. In an embodiment of the disclosure, the first electrode 313 may have a stack structure of ITO/Ag/ITO.

The first electrode 313 may be connected to the drain electrode 311 or the source electrode 310. In the following description, for convenience of explanation, a case in which the first electrode 313 is connected to the drain electrode 311 is mainly described.

A pixel defining film 316 may be arranged on the protective film 312. The pixel defining film 316 may cover a part of the first electrode 313. The pixel defining film 316 may define a light-emitting area of each sub-pixel by surrounding the edge of the first electrode 313. The first electrode 313 may be patterned for each sub-pixel. The pixel defining film 316 may be an organic film and/or an inorganic film. The pixel defining film 316 may be a single film or a multilayer film including at least one of an organic film or an inorganic film. In this state, the pixel defining film 316 is not limited thereto, and may include various material and various shapes.

The intermediate layer 314 may be arranged on the first electrode 313 in an area exposed by etching a part of the pixel defining film 316. The intermediate layer 314 may be formed along sides of the pixel defining film 316. The intermediate layer 314 may be formed by a deposition process.

The intermediate layer 314 may include an organic emissive layer.

In an embodiment of the disclosure, the intermediate layer 314 may include an organic emissive layer, and further include at least any one of a hole injection layer (HIL), a hole transport layer (HTL), an electron transport layer (ETL), an electron injection layer (EIL).

In an embodiment of the disclosure, the intermediate layer 314 may include an organic emissive layer, and further include various other functional layers.

The second electrode 315 may be arranged on the intermediate layer 314.

The second electrode 315 may function as a cathode electrode. The second electrode 315 may include a transparent electrode or a reflective electrode. For example, when the second electrode 315 is used as a transparent electrode, the second electrode 315 may include a metal film and a transparent conductive film arranged on the metal film. When the second electrode 315 is used as a reflective electrode, the second electrode 315 may include a metal film.

In an embodiment of the disclosure, a plurality of sub-pixels may be formed on the display substrate 301. For example, each of the sub-pixels may implement a red, green, blue, or white color. However, the disclosure is not limited thereto.

The TFE layer 130 may cover the OLED.

The TFE layer 130 may include first and second inorganic films 318 and 319 and an organic film 320, which are alternately stacked. For example, the first inorganic film 318, the organic film 320, and the second inorganic film 319 may be sequentially stacked on the OLED. The stack structure of an inorganic film and an organic film in the TFE layer 130 may be changed in various ways.

A touch screen 340 may be provided on the TFE layer 130. In an embodiment of the disclosure, the touch screen 340 may be an electrostatic capacitive type touch screen. For example, a base layer may be arranged on the TFE layer 130. A plurality of touch electrode wirings may be arranged on the base layer. In an embodiment of the disclosure, each of the touch electrode wirings may have a stack structure of Ti/Al/Ti. In another embodiment of the disclosure, the touch screen 340 may omit a base layer. The touch electrode wirings may be covered by a touch electrode insulating film. The touch electrode insulating film may be an organic film or an inorganic film.

A first insulating film 331 may be arranged on the display substrate 301 in the pad area PA. The first insulating film 331 may be arranged on the same layer as the barrier film 302. In other words, the first insulating film 331 may include the same material as the barrier film 302, and may be formed in the same process as the barrier film 302. The first insulating film 331 and the barrier film 302 may be directly disposed on the display substrate 301.

A second insulating film 332 may be arranged on the first insulating film 331. The second insulating film 332 may be arranged on the same layer as the gate insulating film 307. In other words, the second insulating film 332 may include the same material as the gate insulating film 307, and may be formed in the same process as the gate insulating film 307.

A first conductive layer 410 provided in each of the pad terminals 400 may be arranged on the second insulating film 332. The first conductive layer 410 may be electrically connected to a wiring 325 extended from the display area DA. For example, the first conductive layer 410 may be in direct contact with the wiring 325. The first conductive layer 410 may be arranged on the same layer as the gate electrode 308. In other words, the first conductive layer 410 may include the same material as the gate electrode 308, and may be formed in the same process as the gate electrode 308. A plurality of first conductive layers 410 may be arranged apart from each other in one direction on the display substrate 301.

A third insulating film 333 may be arranged on the first conductive layer 410. The third insulating film 333 may be arranged on the same layer as the interlayer insulating film 309. The third insulating film 333 may include the same material as the interlayer insulating film 309, and may be formed in the same process as the interlayer insulating film 309. In an embodiment of the disclosure, the third insulating film 333 may be an organic film or an inorganic film.

The third insulating film 333 may cover at least part of the first conductive layer 410. A contact hole 431 may be formed on the first conductive layer 410 by removing a part of the third insulating film 333. An upper surface of the first conductive layer 410 may be exposed to the outside in an area where the contact hole 431 is formed. One side of the contact hole 431 may be formed by the third insulating film 333 and another side of the contact hole 431 may be formed by the wiring 325.

A second conductive layer 420 may be arranged on the first conductive layer 410. The first and second conductive layers 410 and 420 may be in direct contact with each other. The second conductive layer 420 may be arranged like an island on the first conductive layer 410. In another embodiment of the disclosure, the second conductive layer 420 may be electrically connected to the wiring 325 extended from the display area DA.

The second conductive layer 420 may be arranged on the same layer as the source electrode 310 and the drain electrode 311. In other words, the second conductive layer 420 may include the same material as the source electrode 310 and the drain electrode 311, and may be formed in the same process as the source electrode 310 and the drain electrode 311. In an embodiment of the disclosure, the second conductive layer 420 may include a plurality of layers and have a stack structure of layers including one or more of Al and Ti. The stack structure of the second conductive layer 420 may be variously embodied such as Al/Ti/Al, Ti/Al/Ti, and the like. In this state, the second conductive layer 420 is not limited thereto, and may include various materials or various structures.

Referring to FIG. 3, the second conductive layer 420 may be electrically connected to the first conductive layer 410 through the contact hole 431. In other words, the second conductive layer 420 may be electrically connected to the first conductive layer 410 in an area where the third insulating film 333 is not present. The first conductive layer 410 and the second conductive layer 420 may form a contact portion in an area where the contact hole 431 is arranged.

The second conductive layer 420 may extend over a partial area of the first conductive layer 410 exposed through the contact hole 431 and an area where the third insulating film 333 covering the first conductive layer 410 is arranged. In other words, the second conductive layer 420 may overlap the third insulating film 333.

The first conductive layer 410 and the second conductive layer 420 may be electrically connected to each other in the contact hole 431 where the third insulating film 333 is partially removed. The first conductive layer 410 and the second conductive layer 420 may not be connected to each other in an area where the third insulating film 333 is provided therebetween. One part of the second conductive layer 420 may be arranged in the area of the first conductive layer 410 that is exposed through the contact hole 431, and the other part of the second conductive layer 420 may be arranged on the third insulating film 333.

As described below, the driving terminals 190 may be electrically connected to the pad terminals 400. A circuit pattern 192 may be arranged on the driving chip 180. A terminal insulating film 191 may cover a part of the circuit pattern 192. The driving terminals 190 may be electrically connected to the circuit pattern 192. The driving terminals 190 may include one or more of gold (Au), nickel (Ni), and tin (Sn). In this state, the driving terminals 190 are not limited thereto, and may include various materials.

The driving terminals 190 may extend over an area where the first conductive layer 410 and the second conductive layer 420 are electrically connected to each other and an area where the first conductive layer 410 and the second conductive layer 420 are arranged apart from each other with the third insulating film 333 therebetween.

In an embodiment of the disclosure, the first conductive layer 410 and the second conductive layer 420 may be arranged on the same layer as the gate electrode 308, the source electrode 310, and the drain electrode 311, but also a different metal layer arranged on the display substrate 301 of FIG. 3, for example, metal layers selected from among the first electrode 313, the second electrode 315, and a touch electrode 322.

In an embodiment of the disclosure, the third insulating film 333 may be arranged on the same layer as the interlayer insulating film 309, but also an insulating film selected from among the gate insulating film 307, the protective film 312, the pixel defining film 316, the TFE layer 130, and the touch electrode insulating film, which are patterned on the display substrate 301 of FIG. 3.

The pad terminals 400 that are electrically connected to the driving terminals 190 may be arranged in the pad area PA. The pad terminals 400 may be arranged apart from each other in one direction on the display substrate 301.

Figure 4:
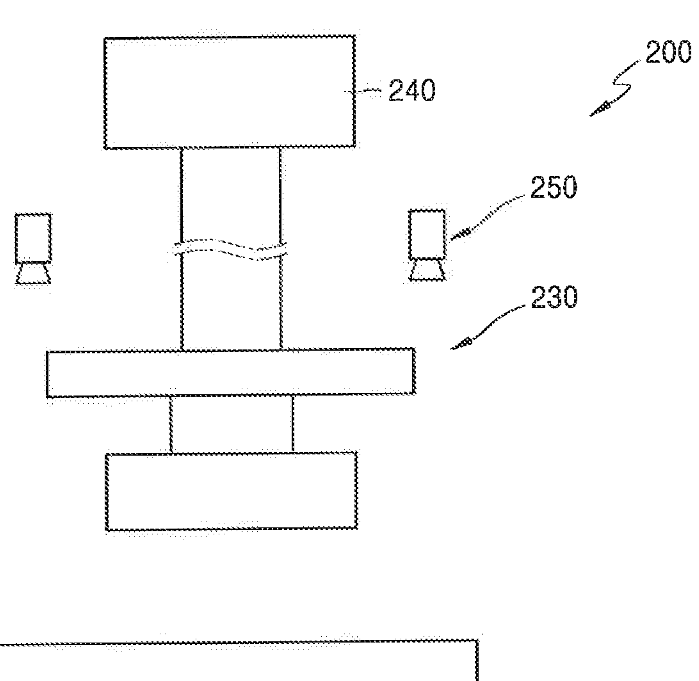
FIG. 4 is a front view of an apparatus for manufacturing a display device, according to one or more embodiments of the disclosure.
Figure 4:
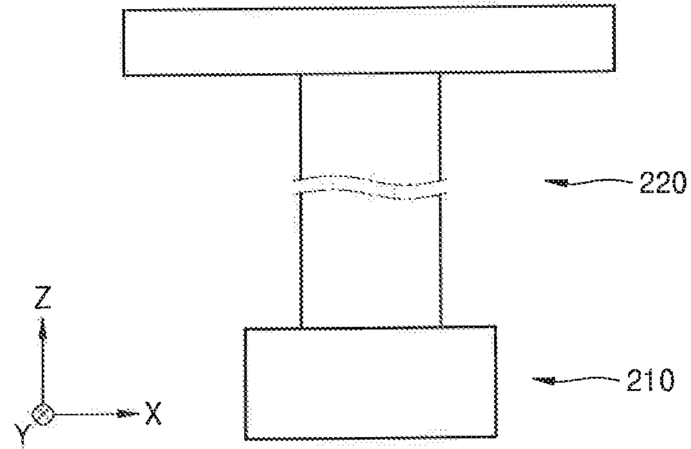
Figure 5:
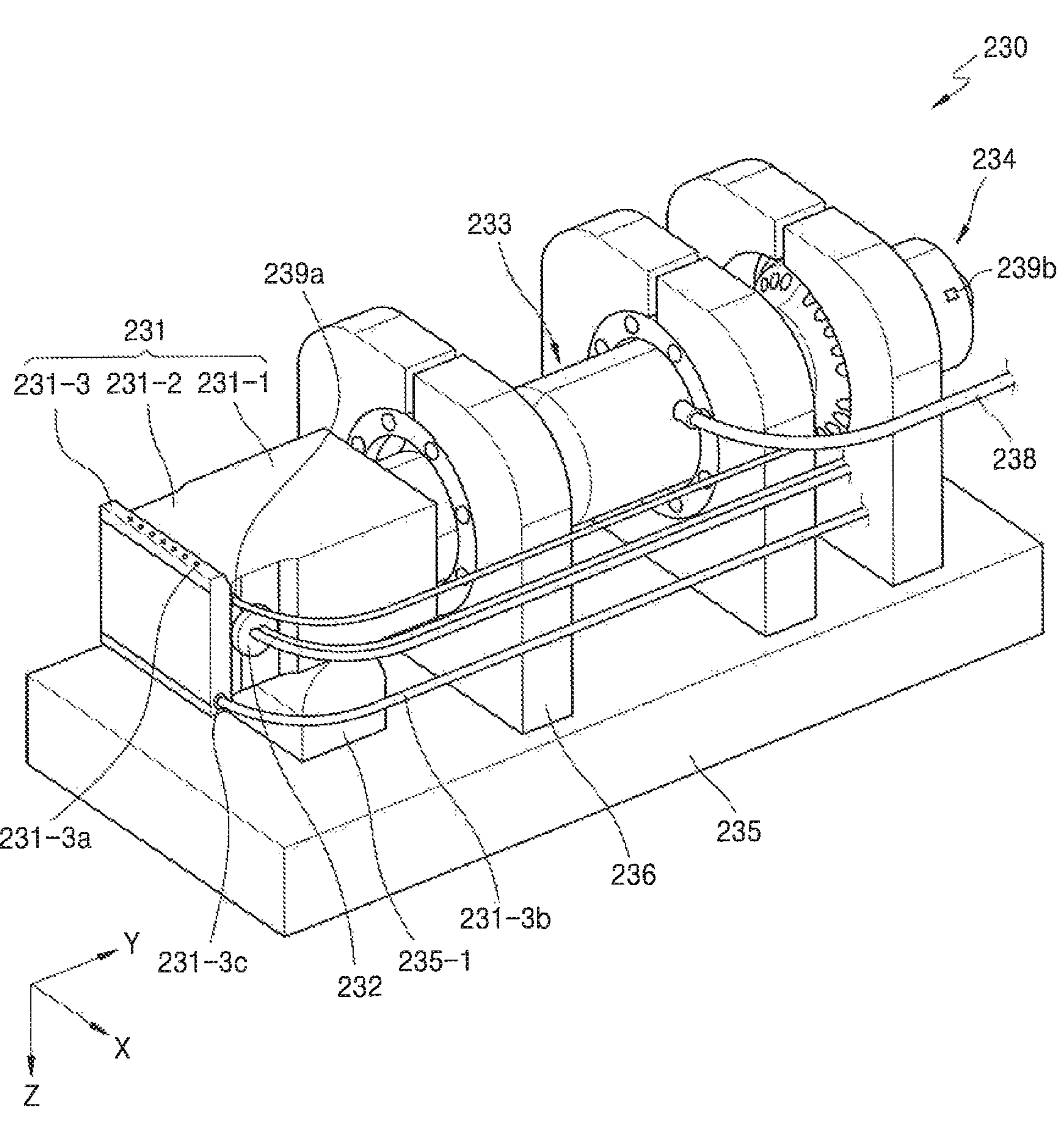
FIG. 5 is a perspective view of a bonding unit of FIG. 4.
Figure 6A:
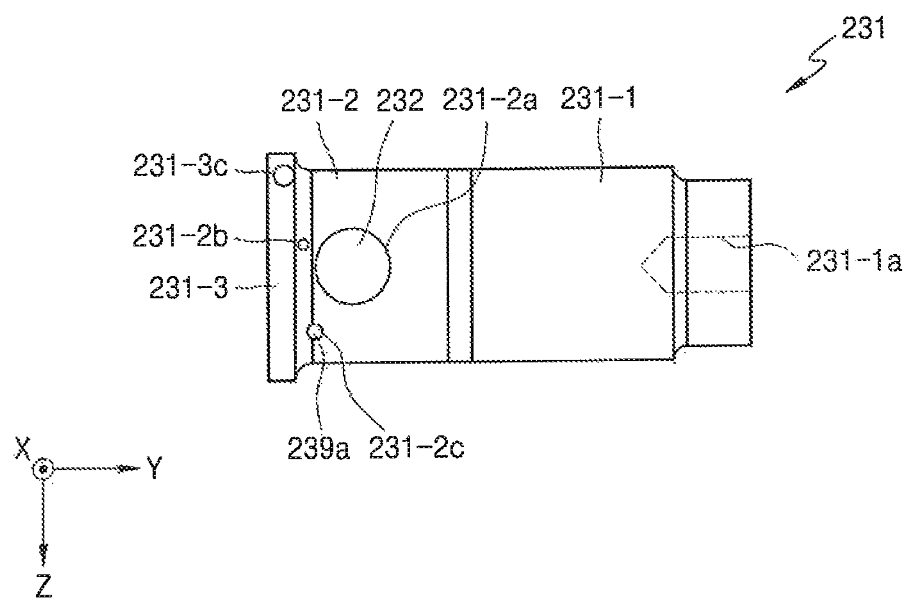
FIG. 6A is a side view of a head portion of FIG. 5.
Figure 6B:
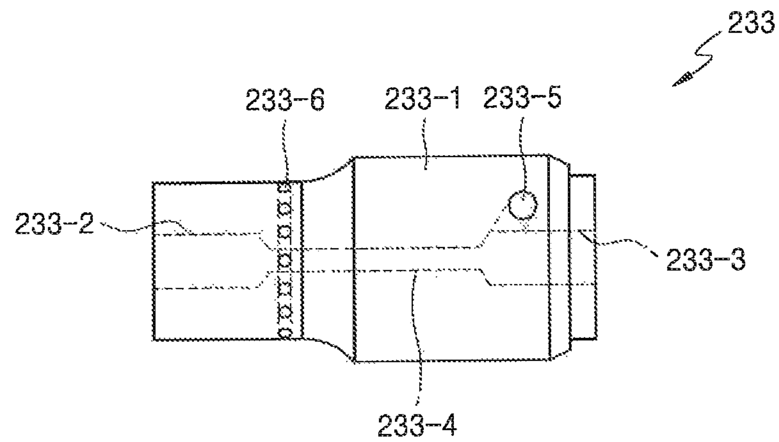
FIG. 6B is a side view of a booster portion of FIG. 5.
Figure 6C:
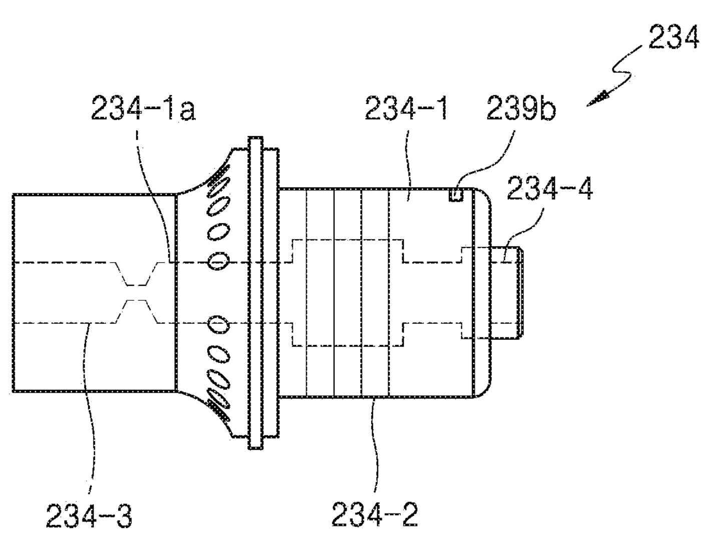
FIG. 6C is a side view of a converter portion of FIG. 5.

FIG. 4 is a front view of an apparatus 200 for manufacturing a display device, according to one or more embodiments of the disclosure. FIG. 5 is a perspective view of a bonding unit 230 of FIG. 4. FIG. 6A is a side view of a head portion 231 of FIG. 5. FIG. 6B is a side view of a booster portion 233 of FIG. 5. FIG. 6C is a side view of a converter portion 234 of FIG. 5.

Referring to FIG. 4, the apparatus 200 for manufacturing a display device may include a first linear driving portion 210, a first stage 220, the bonding unit 230, a second linear driving portion 240, a temperature detection portion, and a vision portion 250.

The first linear driving portion 210 is connected to the first stage 220 and is capable of ascending and descending the first stage 220. In other words, the first linear driving portion 210 may move the first stage 220 in the Z-axis direction. The first linear driving portion 210 may have various shapes. In an embodiment of the disclosure, the first linear driving portion 210 may include a cylinder. In another embodiment of the disclosure, the first linear driving portion 210 may include a ball screw connected to the first stage 220, and a motor connected to the ball screw to operate the ball screw. In another embodiment of the disclosure, the first linear driving portion 210 may include a linear motor connected to the first stage 220. In another embodiment of the disclosure, the first linear driving portion 210 may include a rack gear connected to the first stage 220, a spur gear connected to the rack gear, and a motor for rotating the spur gear. The first linear driving portion 210 is not limited thereto, and may include any device and structure capable of linearly moving the first stage 220 by being connected to the first stage 220.

The display panel 110 may be placed on the first stage 220. In this state, the first stage 220 has the form of a vacuum chuck to be capable of fixing the display panel 110. Furthermore, the first stage 220 may be capable of finely adjusting the position of the display panel 110. For example, the first stage 220 may have the form of a MN stage. In an embodiment of the disclosure, the first stage 220 may be connected to the first linear driving portion 210 to perform a linear motion. In another embodiment of the disclosure, the first stage 220 may be fixedly arranged on the ground, a wall surface of a building, mechanical equipment, and the like. However, in the following description, for convenience of explanation, a case in which the first stage 220 is connected to the first linear driving portion 210 is mainly described.

Referring to FIG. 5, the driving chip 180 may be arranged on the bonding unit 230, and the bonding unit 230 may bond the driving chip 180 to the display panel 110. In this state, the bonding unit 230 may include the head portion 231, a heater portion 232, the booster portion 233, the converter portion 234, a connection portion 236, a support portion 235, and a cooling portion.

Referring to FIGS. 5 and 6A, the head portion 231 may include a head body portion 231-1 connected to the booster portion 233, a neck portion 231-2 protruding from the head body portion 231-1, and a tip portion 231-3 arranged at an end portion of the neck portion 231-2.

The head body portion 231-1 may be formed in various shapes. For example, the head body portion 231-1 may be one of a polygonal column such as a circular column, a rectangular column, and the like. The head body portion 231-1 may be provided with a first coupling hole **231-1*a* into which a first coupling member is inserted, during coupling with the booster portion 233**. In this state, the first coupling member may have the form of a headless set screw.

The neck portion 231-2 may be connected to the head body portion 231-1, and an area of a section of the neck portion 231-2 perpendicular to the lengthwise direction of the neck portion 231-2 may vary. For example, the area of the section perpendicular to the lengthwise direction of the neck portion 231-2 may decrease farther away from the head body portion 231-1 along the lengthwise direction of the neck portion 231-2 and then may be maintained constant at a certain distance or more. In an embodiment of the disclosure, a surface or an outer surface of a portion of the neck portion 231-2 connected to the head body portion 231-1 may be rounded (or curved). Accordingly, when the head portion 231 vibrates, through a portion of the neck portion 231-2 where the area of the section perpendicular to the lengthwise direction of the neck portion 231-2 is variable, not only is the vibration range of the tip portion 231-3 increased, but also the concentration of excessive stress at the neck portion 231-2 is prevented. Furthermore, through a portion of the neck portion 231-2 where the area of the section perpendicular to the lengthwise direction of the neck portion 231-2 is constant, the strength between the neck portion 231-2 and the head body portion 231-1 is reinforced so that a boundary between the neck portion 231-2 and the head body portion 231-1 is prevented from being damaged.

A heater insertion hole **231-2*a* into which the heater portion 232 is inserted may be formed in the neck portion 231-2. In this state, the heater insertion hole 231-2*a* may be perpendicular to the height direction, for example, a +Z direction of FIG. 5, of the neck portion 231-2, and arranged on a straight line passing the center of the head portion 231. Furthermore, a first insertion hole 231-2*c* in which a first temperature detection portion 239*a* to be described below is arranged may be arranged in the neck portion 231-2. In this state, the first insertion hole 231-2*c* may be arranged closest to the tip portion 231-3 with respect to the center of the neck portion 231-2. In another embodiment of the disclosure, the first temperature detection portion 239*a* may be arranged in the tip portion 231-3. However, in the following description, for convenience of explanation, a case in which the first temperature detection portion 239*a* is arranged in the neck portion 231-2** is mainly described.

The head portion 231 configured as above may include an amplitude control hole **231-2*b* for controlling the amplitude of the tip portion 231-3. In this state, the number and position of the amplitude control hole 231-2*b* may be used to control the amplitude of the tip portion 231-3. For example, a plurality of amplitude control holes 231-2*b* may be formed to provide greater control of the amplitude of the tip portion 231-3. In particular, when the amplitude control hole 231-2*b* is formed, the amplitude control hole 231-2*b* may change the amplitude and/or frequency of vibration generated at the end portion of the tip portion 231-3. For example, no separate structure may be provided in the amplitude control hole 231-2*b*. In this case, the amplitude control hole 231-2*b* may be able to vary the amplitude and/or frequency of vibration of the tip portion 231-3 where the amplitude control hole 231-2*b* is not provided, depending on the number, diameter, and position of the amplitude control hole 231-2*b*. Accordingly, in the above case, it is possible to conveniently implement vibration having a desired amplitude and frequency without changing the shape of the head portion 231**.

The tip portion 231-3 may protrude from the end portion of the neck portion 231-2 in a direction perpendicular to the lengthwise direction of the neck portion 231-2. In this state, since a suction hole **231-3*a* is formed in the tip portion 231-3, the driving chip 180 may be fixed on the tip portion 231-3. A pipe 231-3*b* for sucking a gas in the suction hole 231-3*a* or guiding a gas to the suction hole 231-3*a* may be connected to the tip portion 231-3. In this state, the tip portion 231-3 may include a connection hole 231-3*c* to which the pipe 231-3*b*** is connected.

In the above case, a bonding portion of the tip portion 231-3, for example, the portion of the tip portion 231-3 in contact with the driving chip 180, may be a position where the amplitude of a resonance frequency generated in the tip portion 231-3 during the operation of the converter portion 234 is maximum. In other words, the bonding portion of the tip portion 231-3 may be a position where the resonance frequency is ½. In this state, the bonding portion of the tip portion 231-3 may have a flat shape.

The heater portion 232 may be inserted in the head portion 231. In this state, the heater portion 232 may be arranged at the center of the height direction of the head portion 231. The heater portion 232 may have a circular column shape. Since heat generated by the heater portion 232 is uniformly transferred in various directions of the head portion 231, the temperature of the tip portion 231-3 may be maintained constant. The length of the heater portion 232 may be almost the same as the width in one direction, for example, the X direction of FIG. 5, of the head portion 231. However, the length of the heater portion 232 is not limited to the above description.

Referring to FIGS. 5 and 6B, the booster portion 233 may be connected to the head portion 231. The booster portion 233 and the head portion 231 may be connected by the first coupling member such as a headless set screw and the like, and the booster portion 233 may have a second coupling hole 233-2 into which the first coupling member such as a headless set screw and the like is inserted. The booster portion 233 may have various shapes. For example, the shape, size, and the like of the booster portion 233 may be changed to vary the amount of vibration at the end portion of the head portion 231.

The booster portion 233 may have a third coupling hole 233-3 into which a second connection member for connection with the converter portion 234 is inserted. Furthermore, the booster portion 233 may include a first flow path 233-4 for communicating the second coupling hole 233-2 and the third coupling hole 233-3. In other words, the first flow path 233-4 is provided to permit material or gas flow from the third coupling hole 233-3 to the second coupling hole 233-2. The first flow path 233-4 may be connected to a first inlet 233-5 through which a gas is introduced and a first outlet 233-6 through which a gas is discharged. The first inlet 233-5 may be connected to a supply pipe 238 through which a gas is supplied from the outside. In this state, the first inlet 233-5 may be arranged farther from the head portion 231 than the first outlet 233-6. The supply pipe 238 may have a tube shape. In this state, a separate pump or compressor and the like is arranged in the supply pipe 238 to circulate the gas. Furthermore, a gas supply tank for supplying a gas used for cooling may be connected to the pump and the like. However, in the following description, for convenience of explanation, a case in which the gas is air is mainly described. The first outlet 233-6 may include a plurality of first outlets radially arranged on an outer surface 233-10 of the booster portion 233. In this state, the first outlets 233-6 may be arranged apart from each other in the same interval. Accordingly, when the gas is discharged to the outside through each of the first outlets 233-6, the vibration of the booster portion 233 may be reduced. In this case, the first outlets 233-6 may be connected to the first flow path 233-4. For example, the first outlets 233-6 may be arranged between the first flow path 233-4 and the second coupling hole 233-2. The first flow path 233-4 may extend in the lengthwise direction of the booster portion 233. In this state, the first flow path 233-4 may connect the second coupling hole 233-2 to the third coupling hole 233-3. In another embodiment of the disclosure, the first flow path 233-4 may be connected to just the third coupling hole 233-3. In the following description, for convenience of explanation, a case in which the first flow path 233-4 is connected to both the second coupling hole 233-2 and the third coupling hole 233-3 is mainly described.

In the above case, a second coupling member is formed such that the center thereof is penetrated. In this case, a cavity formed in the center of the second coupling member may be connected to the first flow path 233-4. In another embodiment of the disclosure, a cavity may not be formed at the center of the second coupling member. In this state, the gas moving through the first flow path 233-4 may move through a space between the third coupling hole 233-3 and the second coupling member. However, in the following description, for convenience of explanation, a case in which a cavity penetrating the center of the second coupling member is formed is mainly described.

The booster portion 233 may include Al and/or Ti.

Referring to FIGS. 5 and 6C, the converter portion 234 may be connected to the booster portion 233 and may generate vibration. In this case, the converter portion 234 may include a converter body 234-1 and a vibration generation portion 234-2. The converter body 234-1 may include a fourth coupling hole 234-3 into which the second coupling member is inserted. Furthermore, the converter body 234-1 may include a second flow path **234-1*a* connected to the fourth coupling hole 234-3. In this state, at least a part of the converter body 234-1 may include Al and/or Ti. For example, a part of the converter body 234-1 where the fourth coupling hole 234-3 is formed may include Al and/or Ti. In another embodiment of the disclosure, the whole of the converter body 234-1 may include Al and/or Ti. The second flow path 234-1*a* may be connected to the fourth coupling hole 234-3, and may be formed to penetrate the converter body 234-1. In this state, the second flow path 234-1*a*, which is connected to the end portion of the converter body 234-1**, may guide the gas to the outside.

The cross-sectional area of the inside of the second flow path **234-1*a* may vary depending on the lengthwise direction of the converter body 234-1. For example, a portion of the second flow path 234-1*a* connected to the fourth coupling hole 234-3 has the smallest cross-sectional area, and the small-size cross-sectional area of the second flow path 234-1*a* may be extended for a certain distance away from the fourth coupling hole 234-3 until it increases. Furthermore, the cross-sectional area of the second flow path 234-1*a* in a portion where the vibration generation portion 234-2 is arranged may be greater than the cross-sectional area of other portions of the second flow path 234-1*a*. In this case, the gas introduced into the fourth coupling hole 234-3 may move at a fast speed while passing through an area where the cross-sectional area of the second flow path 234-1*a* is less than the cross-sectional area of the second coupling hole 233-2. Furthermore, since the moving speed of the gas decreases while the gas moves from an area having the smallest cross-sectional area of the second flow path 234-1*a* to an area having the largest cross-sectional area of the second flow path 234-1*a*, the gas may remain for a long time in the area having the largest cross-sectional area of the second flow path 234-1*a*. Accordingly, due to the cooling by the gas in the extended portion of the second flow path 234-1*a* provided in the vibration generation portion 234-2, the temperature of the vibration generation portion 234-2** may be prevented from rising.

The vibration generation portion 234-2 may generate vibration in response to an external signal applied thereto. In this state, the vibration generation portion 234-2 may include at least one vibration generation portion. The vibration generation portion 234-2 may include a piezoelectric transducer (PZT).

Referring to FIG. 5, the connection portion 236, which is fixed on the support portion 235, may connect the head portion 231, the booster portion 233, and the converter portion 234 to the support portion 235. In this state, the connection portion 236 may be in contact with at least one of the head portion 231, the booster portion 233, and the converter portion 234. In this state, an elastic member capable of absorbing vibration may be arranged between the connection portion 236 and at least one of the head portion 231, the booster portion 233, and the converter portion 234. In another embodiment of the disclosure, the connection portion 236 may be arranged at an area where the head portion 231 is connected to the booster portion 233 or an area where the booster portion 233 is connected to the converter portion 234, to be connected to the head portion 231, the booster portion 233, or the converter portion 234. In another embodiment of the disclosure, the connection portion 236 may be coupled to at least one of a first connection member and the second connection member. In the above case, the connection portion 236 may be arranged to contact a nodal point of the head portion 231, the booster portion 233, and the converter portion 234. The nodal point may correspond to an area where amplitude is 0 when the vibration generation portion 234-2 is in operation.

The support portion 235 may be connected to the connection portion 236, and to the second linear driving portion 240. In this state, the support portion 235 may have a plate shape, and a plurality of connection portions 236 arranged apart from each other may be coupled to the support portion 235.

The support portion 235 may include a force applying portion 235-1 that is in contact with the head portion 231. In this state, the force applying portion 235-1 may guide the head portion 231 to vibrate not in the Z-axis direction of FIG. 5, but in the X-axis direction and/or Y-axis direction, during the vibration of the head portion 231. The force applying portion 235-1 may be in contact with a nodal point formed in the head portion 231.

Referring to FIGS. 6B and 6C, the cooling portion may include the first flow path 233-4, the first inlet 233-5, the first outlet 233-6, the third coupling hole 233-3, the fourth coupling hole 234-3, and the second flow path 234-1*a*. In this state, the cooling portion may circulate air inside at least one of the booster portion 233 and the converter portion 234. In this case, the cooling portion may prevent the heat generated from the heater portion 232 from being transferred to the converter portion 234.

Referring to FIG. 4, the second linear driving portion 240 may be connected to the bonding unit 230 to have the bonding unit 230 perform a linear motion. For example, the second linear driving portion 240 may have the bonding unit 230 ascend and descend. In other words, the bonding unit 230 may ascend and descend in the Z-axis direction by the second linear driving portion 240. In an embodiment of the disclosure, the second linear driving portion 240 may be arranged in the same direction as the first linear driving portion 210 to have the bonding unit 230 ascend and descend. In this case, the second linear driving portion 240 may be arranged below the bonding unit 230. In another embodiment of the disclosure, the second linear driving portion 240 may be arranged in a different direction from the first linear driving portion 210 to have the bonding unit 230 ascend and descend. In this state, the second linear driving portion 240 may be arranged above the bonding unit 230. Since the second linear driving portion 240 is formed the same as or similar to that described above regarding the first linear driving portion 210, a detailed description thereof is omitted. In the following description, for convenience of explanation, a case in which the second linear driving portion 240 is arranged above the bonding unit 230 is mainly described.

Referring to FIG. 5, the temperature detection portion may measure the temperature of the tip portion 231-3 and/or the converter portion 234. In this state, the temperature detection portion may include the first temperature detection portion 239*a* arranged in the tip portion 231-3. The first temperature detection portion 239*a* may be arranged close to the tip portion 231-3 to detect the temperature around the tip portion 231-3.

The temperature detection portion may include a second temperature detection portion 239*b* arranged in the converter portion 234. In this state, the second temperature detection portion 239*b* may measure the temperature of the vibration generation portion 234-2. In the above case, the second temperature detection portion 239*b* may be arranged adjacent to the vibration generation portion 234-2.

Referring to FIG. 4, the vision portion 250 may be arranged at various positions to detect the position of the display panel 110. For example, the vision portion 250 may be arranged above the bonding unit 230, as illustrated in FIG. 4. In another embodiment of the disclosure, the vision portion 250 may be arranged at a side surface of the bonding unit 230. In another embodiment of the disclosure, the vision portion 250 may be arranged between the bonding unit 230 and the first stage 220. In the following description, for convenience of explanation, a case in which the vision portion 250 is not arranged above the bonding unit 230 is mainly described. In this state, the vision portion 250 may be arranged to detect the position of the display panel 110 without interference with the bonding unit 230.

The vision portion 250 may include a camera and the like. The position of the display panel 110 may be compared with a preset position based on the image of the display panel 110 captured by the vision portion 250 or an alignment mark of the display panel 110 and the like. Accordingly, by varying the position of the bonding unit 230 or adjusting the position of the display panel 110, the driving chip 180 may be accurately mounted on the display panel 110.

In the operation of the apparatus 200 for manufacturing a display device, the apparatus 200 for manufacturing a display device may arrange and bond the driving chip 180 on the pad terminals 400 of the display panel 110. The driving chip 180 may be placed on the tip portion 231-3 in a fixed state.

The vision portion 250 may detect the position of the display panel 110. The vision portion 250 may calculate a relative position between the display panel 110 and the driving chip 180 or between the display panel 110 and the bonding unit 230, by comparing the position with a preset position based on the detected position of the display panel 110. Then, the position of the display panel 110 may be adjusted or the position of the bonding unit 230 may be adjusted by adjusting the first stage 220 to correspond to a bonding position where the driving chip 180 is to be mounted on the display panel 110, based on the relative position between the display panel 110 and the driving chip 180 or the relative position between the display panel 110 and the bonding unit 230. In this case, an alignment structure to finely adjust the position of the bonding unit 230 may be arranged between the bonding unit 230 and the second linear driving portion 240.

As described above, when the positions of the driving chip 180 and the display panel 110 are aligned to each other, the second linear driving portion 240 may be operated to bond the driving chip 180 on the display panel 110.

In the above case, when the vibration generation portion 234-2 is operated to generate vibration, the vibration may be transferred to the tip portion 231-3 through the converter portion 234 and the booster portion 233. In this state, the heater portion 232 may be in an operating state, and the tip portion 231-3 may simultaneously apply heat and vibration to the driving chip 180.

As described above, when the heater portion 232 is operated as the vibration is applied to the tip portion 231-3, the heat of the heater portion 232 may be transferred to the vibration generation portion 234-2 through the booster portion 233. In this state, when the temperature of the vibration generation portion 234-2 increases, the vibration generation portion 234-2 may malfunction or the amplitude and/or frequency of vibration generated from the vibration generation portion 234-2 may vary.

As described above, to prevent the heat of the heater portion 232 from affecting the vibration generation portion 234-2, the cooling portion may prevent the heat of the heater portion 232 from being transferred to the vibration generation portion 234-2.

For example, a gas may be supplied to the first inlet 233-5. The gas may be moved to the first flow path 233-4 through the first inlet 233-5, and may pass through the inside of the booster portion 233 to be discharged to the first outlet 233-6. Furthermore, part of the gas introduced to the first inlet 233-5 may pass through the second coupling member, and move to the second flow path 234-1*a* to be discharged to the rear side of the converter portion 234. Alternatively, part of the gas introduced to the first inlet 233-5 may pass between the second coupling member and the booster portion 233 to move to the converter portion 234.

As described above, the gas passing through the inside of the converter portion 234 and the booster portion 233 may exchange heat with the booster portion 233 and/or the head portion 231 to be discharged to the outside through the first outlet 233-6. Accordingly, the booster portion 233 and/or the head portion 231 may be cooled by the gas. For example, the booster portion 233 and/or the head portion 231 may be cooled due the gas remaining in the vibration generation portion 234-2 for a relatively long time.

In the above case, even when the heater portion 232 is in operation, the temperature of the vibration generation portion 234-2 may not increase. For example, when the heater portion 232 is in operation, the temperature of the tip portion 231-3 may be within a range of about 250° C. or more and about 300° C. or less. However, as described above, when the gas passes through the first flow path 233-4 of the booster portion 233 and the second flow path 234-1*a* of the converter portion 234, the temperature of the vibration generation portion 234-2 is maintained at about 50° C. or less. In particular, in the above case, the resonant frequency of vibration of the tip portion 231-3 may be variable depending on the temperature of the tip portion 231-3. In this case, a change amount of the resonant frequency of vibration that varies depending on the temperature of the tip portion 231-3 is within a range of 1 kHz, and even when the heater portion 232 is operated, the tip portion 231-3 may be vibrated within a range of an initially designed resonant frequency of vibration.

Accordingly, since the heat of the heater portion 232 is blocked through the cooling portion while using the heater portion 232, the vibration generation portion 234-2 may be stably operated.

The cooling portion and the heater portion 232 may be operated based on the results of detection by the first temperature detection portion 239*a* and the second temperature detection portion 239*b*. For example, whether to operate the heater portion 232 may be determined based on the temperature of the head portion 231 (or the temperature of the tip portion 231-3) detected by the first temperature detection portion 239*a*. In other words, when the temperature of the head portion 231 is lower than a preset first temperature, the heater portion 232 may be operated. In contrast, when the temperature of the head portion 231 is higher than the preset first temperature, the operation of the heater portion 232 may be stopped. Accordingly, the temperature of the tip portion 231-3 may be maintained uniform and constant.

The booster portion 233 and/or the converter portion 234 may be cooled through the cooling portion based on the result of detection by the second temperature detection portion 239*b*. For example, when the temperature detected by the second temperature detection portion 239*b* is lower than a preset second temperature, the gas may not be supplied to the cooling portion. In contrast, when the temperature detected by the second temperature detection portion 239*b* is higher than the preset second temperature, the booster portion 233 and/or the converter portion 234 may be cooled by supplying the gas to the cooling portion.

Accordingly, in the apparatus 200 for manufacturing a display device, the effect of the temperature on the vibration generation portion 234-2 due to a rapid increase in the temperature may be reduced.

The apparatus 200 for manufacturing a display device may not include the booster portion 233, or the head portion 231 and the booster portion 233 may be integrally formed. For example, the head portion 231 may be directly connected to the converter portion 234. In this case, the head portion 231 and the converter portion 234 may be connected to each other through the first coupling member. Furthermore, as in the booster portion 233, a separate gas inlet may be arranged in the converter portion 234, and a second inlet may be in communication with the second flow path 234-1*a* of the converter portion 234. In this case, a second outlet 234-4 may be the same as or similar to the shape shown in FIG. 6C. In another embodiment of the disclosure, the second outlet 234-4 may be formed in a shape similar to the first outlet 233-6 of FIG. 6B along an outer surface of the converter portion 234 or may have a shape similar to the shape as that shown in FIG. 7. In this case, the second inlet may be arranged at the downstream side of an air flow further than the second outlet 234-4.

Figure 7:
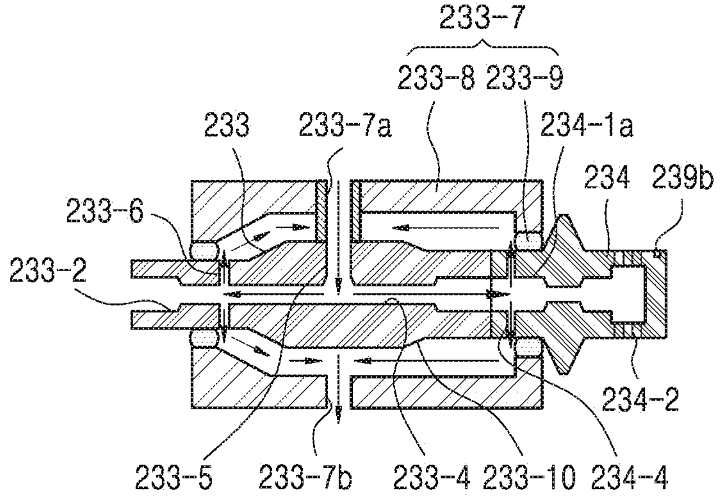
FIG. 7 is a cross-sectional view of a booster portion, a converter portion, and a cooling pocket of an apparatus for manufacturing a display device, according to one or more embodiments of the disclosure.

FIG. 7 is a cross-sectional view of the booster portion 233, the converter portion 234, and a cooling pocket 233-7 of the apparatus 200 for manufacturing a display device, according to one or more embodiments of the disclosure.

Referring to FIG. 7, the apparatus 200 for manufacturing a display device may be similar to that described above. In the following description, differences from the apparatus 200 for manufacturing a display device of FIG. 5 are mainly described.

The cooling portion may include the cooling pocket 233-7 arranged to surround an outer surface of at least one of the booster portion 233 and the converter portion 234. In this state, the cooling pocket 233-7 may include a cooling pocket inlet 233-7*a* through which a gas is introduced from the outside and a cooling pocket outlet 233-7*b* through which the gas is discharged to the outside. The cooling pocket inlet 233-7*a* and the cooling pocket outlet 233-7*b* may be at opposite sides of the cooling pocket 233-7. In this state, the cooling pocket inlet 233-7*a* may be connected to the first inlet 233-5 arranged in the booster portion 233. In another embodiment of the disclosure, the cooling pocket inlet 233-7*a* may not be connected to the first inlet 233-5, and may be connected to a space between an inner surface of the cooling pocket 233-7 and an outer surface of the booster portion 233. In this case, the gas in the space between an inner surface of the cooling pocket 233-7 and an outer surface of the booster portion 233 may be moved to the first flow path 233-4 through the first inlet 233-5. In the following description, for convenience of explanation, a case in which the first inlet 233-5 and the cooling pocket inlet 233-7*a* are connected to each other is mainly described.

The cooling pocket 233-7 may include a cooling pocket body 233-8. Furthermore, the cooling pocket 233-7 may include a sealing portion 233-9 arranged between the cooling pocket body 233-8 and the booster portion 233 and/or between the cooling pocket body 233-8 and the converter portion 234. In this state, the sealing portion 233-9 may have a ring shape, and include an elastic material. In another embodiment of the disclosure, in the cooling pocket 233-7, the cooling pocket body 233-8 and the sealing portion 233-9 may be integrally formed. In this case, in the cooling pocket 2337, the first coupling member and the second coupling member are coupled to the sealing portion 233-9, and the sealing portion 233-9 may be fixedly arranged between the booster portion 233 and the head portion 231 and between the booster portion 233 and the converter portion 234. In this case, the sealing portion 233-9 may be arranged at a nodal point where no vibration is generated when the vibration generation portion 234-2 is operated.

The converter portion 234 may include the second outlet 234-4 through which the gas introduced through the fourth coupling hole 234-3 is discharged to the outside. In this state, the second outlet 234-4 may be connected to the second flow path 234-1*a*, and may include one or more second outlets. In particular, when the second outlet 234-4 includes a plurality of second outlets, the second outlets 234-4 may be arranged along the outer surface of the converter portion 234 apart from each other at regular intervals. In the above case, the gas discharged through the second outlet 234-4 may be moved to the space between the cooling pocket body 233-8 and the converter portion 234. The space between the cooling pocket body 233-8 and the converter portion 234 may include a first space and a second space opposite each other with the converter portion 234 therebetween.

In the above case, when the heater portion 232 is in operation, the gas for cooling may be supplied through the cooling pocket inlet 233-7*a*. The gas introduced to the cooling pocket inlet 233-7*a* may then be introduced through the first inlet 233-5. Then, the gas introduced through the first inlet 233-5 may be moved to the first flow path 233-4 and the second flow path 234-1*a* through the third coupling hole 233-3 and the fourth coupling hole 234-3. The gas moved to the first flow path 233-4 may be discharged to a space between the cooling pocket body 233-8 and the booster portion 233 through the first outlet 233-6. Furthermore, the gas moved to the second flow path 234-1*a* may be discharged to the space between the converter body 234-1 and the cooling pocket body 233-8 through the second flow path 234-1*a*. In this case, the gas may be moved to a space between the cooling pocket body 233-8 and the converter body 234-1 and the space between the cooling pocket body 233-8 and the booster portion 233. The air in the spaces may be discharged to the outside through the cooling pocket outlet 233-7*b*.

Accordingly, when the heater portion 232 is in operation, the transfer of the heat of the heater portion 232 to the vibration generation portion 234-2 may be effectively prevented. In particular, since the gas for cooling is supplied not only to the inside of the booster portion 233 and/or the converter portion 234, but also to the outside of the booster portion 233 and/or the converter portion 234, the heat generated from the heater portion 232 may be effectively blocked. In other words, the gas may be used to cool both the inside and the outside of the booster portion 233 and/or the converter portion 234.

According to one or more embodiments of the disclosure the apparatus for manufacturing a display device 200 may include: a head portion 231 configured to fix a driving chip 180; a heater portion 232 coupled to the head portion 231; a booster portion 233 connected to the head portion 231; a converter portion 234 connected to the booster portion 233 and configured to vibrate the head portion 231; and a cooling portion (e.g., 233-7) arranged at the converter portion 234 or the booster portion 233 and configured to cool the converter portion 234 or the booster portion 233 by supplying a gas to the converter portion 234 or the booster portion 233.

Figure 8A:
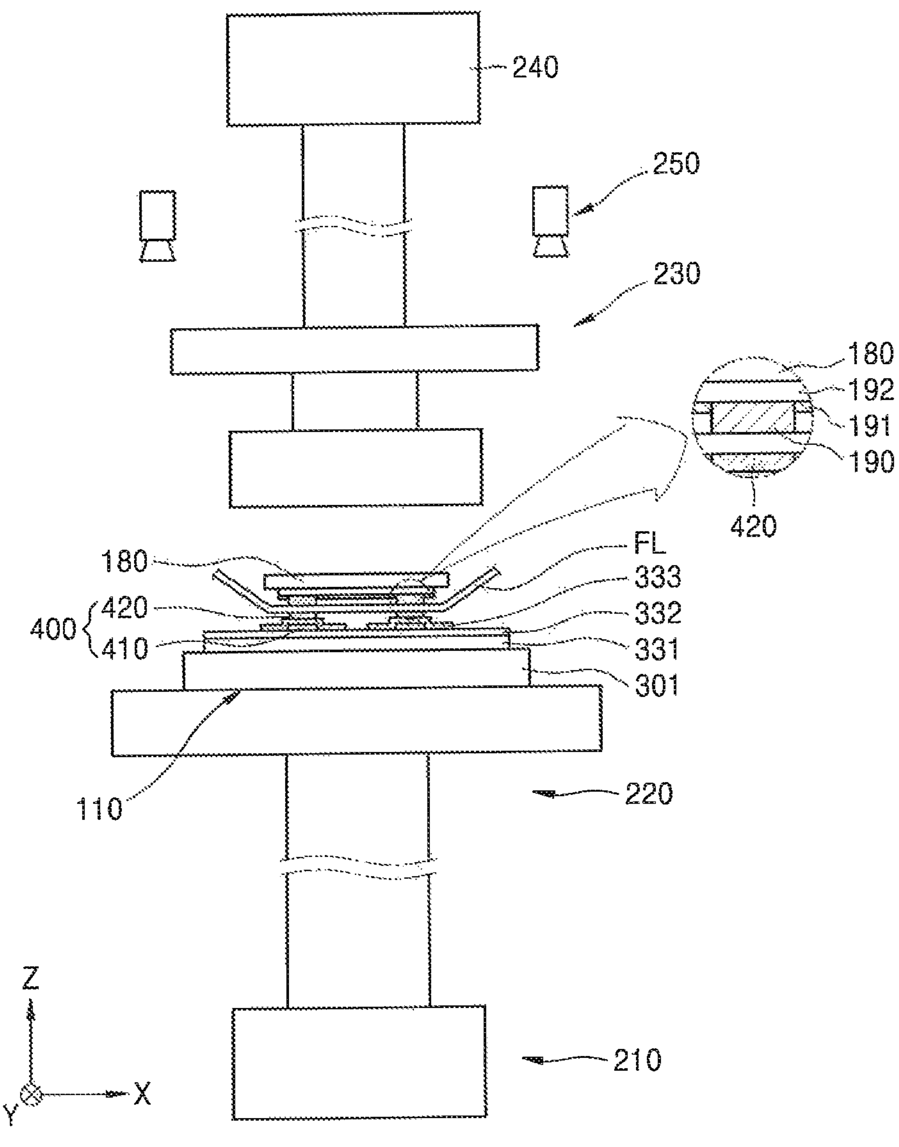
FIGS. 8A and 8B are front views for describing a method of manufacturing a display device, according to one or more embodiments of the disclosure.
Figure 8B:
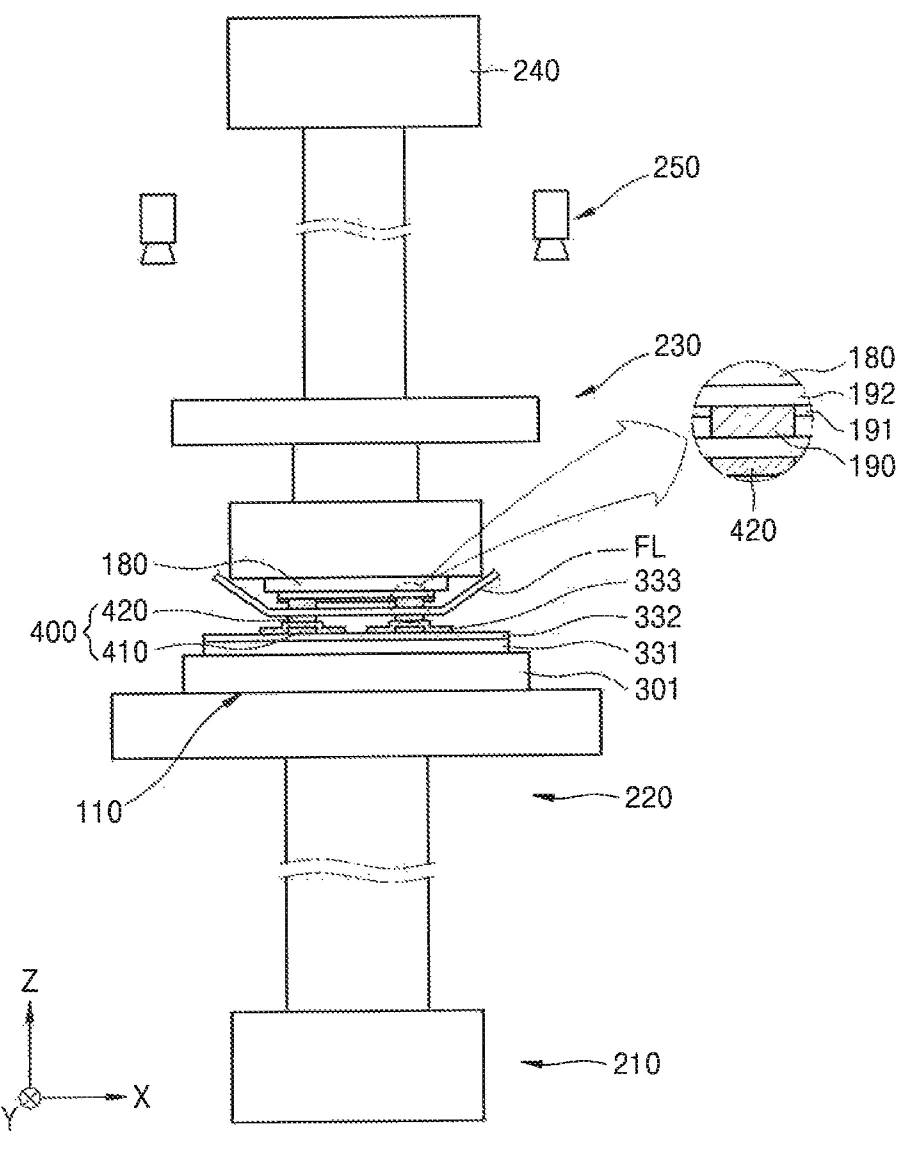

FIGS. 8A and 88 are front views for describing a method of manufacturing a display device, according to one or more embodiments of the disclosure.

Referring to FIGS. 8A and 88, when the driving chip 180 is bonded to the display panel 110, the display panel 110 may be arranged on the first stage 220. In this state, the display panel 110 may be arranged on the first stage 220. A film member FL may be arranged between the display panel 110 and the driving chip 180, and the driving chip 180 is arranged above the display panel 110. In this state, the driving terminal 190 may be in contact with the film member FL, the terminal insulating film 191 may be arranged around the driving terminal 190, and the driving terminal 190 may be connected to the circuit pattern 192 and to the driving chip 180. The film member FL may include an anisotropic film. The anisotropic film may be in a state in which conductive balls are not arranged therein. For example, the film member FL may include a thermoplastic resin (e.g., styrene butadiene, polyvinyl butylene, and the like) that does not contain conductive balls, a thermosetting resin (e.g., epoxy resin, polyurethane, acryl resin, and the like), and/or a photocurable resin. In another embodiment of the disclosure, after the film member FL is arranged on the display panel 110, the driving chip 180 may be arranged, and then the display panel 110 with the film member FL and the driving chip 180 arranged thereon may be arranged on the first stage 220. In the above case, the width of the driving chip 180, for example, measured in an X direction or a Y direction of FIG. 8A, may be 30 mm or more. In this state, the driving chip 180 may have a rectangular shape.

After the above-described arrangement, whether the position of the display panel 110 is at a preset position may be checked through the vision portion 250, and then the position of the display panel 110 may be adjusted.

Then, since the second linear driving portion 240 is operated to descend the bonding unit 230, the driving chip 180 may be bonded to the display panel 110. In this case, the bonding unit 230 may be in a state of applying vibration and heat to a tip portion.

As described above, when vibration is applied to the driving chip 180, the driving chip 180 may be vibrated to be attached to the pad terminals 400 of the display panel 110. In this case, the driving terminals 190 of the driving chip 180 and the pad terminals 400 may overlap each other, and the driving terminals 190 and the pad terminals 400 may be fused to each other due to friction therebetween. In the above case, the film member FL may be deformed to a gel shape by the heat, pressure, and the like applied from the tip portion so as to be pushed to the side surfaces of the driving terminals 190 and the pad terminals 400.

During the above process, a gas from the outside is supplied to cool a part of the bonding unit 230. For example, as described above, the gas may be supplied to the inside and/or outside of a booster portion and a converter portion to cool the booster portion and/or the converter portion.

When the above process is completed, the second linear driving portion 240 may be operated to ascend and descend the bonding unit 230. Then, after a certain time passes, the film member FL may be arranged to surround the outside of the driving terminals 190 and the pad terminals 400 that are bonded to each other, thereby protecting the driving terminals 190 and the pad terminals 400.

Accordingly, according to the method of manufacturing a display device according to one or more embodiments of the disclosure, it is possible to quickly and accurately bond the driving chip 180 to the display panel 110. Furthermore, according to the method of manufacturing a display device according to one or more embodiments of the disclosure, by blocking the heat of the heater portion, the frequency and/or amplitude of vibration of the tip portion may be maintained constant.

According to the method of manufacturing a display device according to one or more embodiments of the disclosure, resin that is described below may be arranged instead of the film member FL. For example, instead of arranging the film member FL as described above, resin may be arranged on the display panel 110, and then the driving chip 180 may be arranged on the resin. Then, when the driving chip 180 is vibrated, due to vibration and/or heat energy by the vibration, the resin arranged between the driving terminals 190 of the driving chip 180 and the pad terminals 400 of the display panel 110 may be moved to the vicinity of the driving terminals 190 and the pad terminals 400. When vibration is continuously applied to the driving chip 180, the driving terminals 190 and the pad terminals 400 may rub against each other so that the driving terminals 190 and the pad terminals 400 may be bonded to each other.

FIGS. 9A to 9D are front views for describing a method of manufacturing a display device, according to one or more embodiments of the disclosure.

Figure 9A:
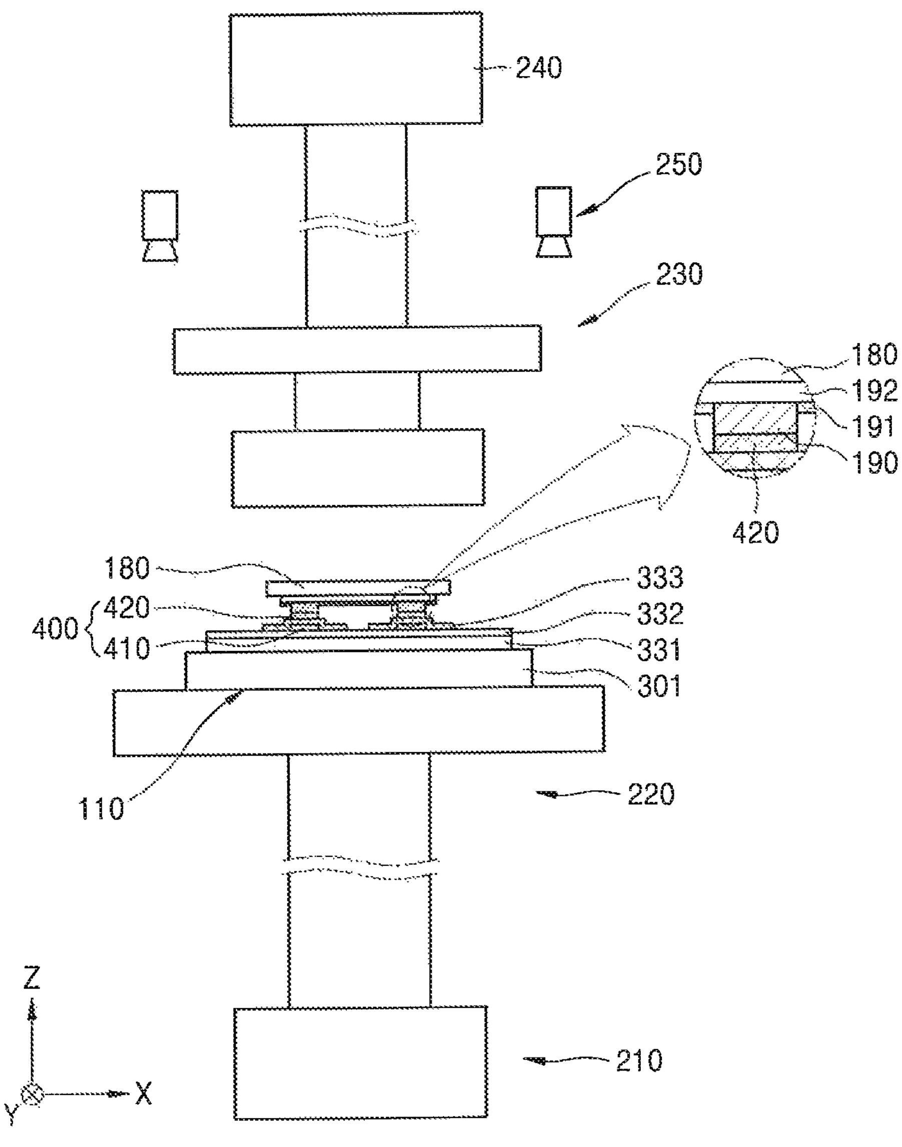
FIGS. 9A, 9B, 9C and 9D are front views for describing a method of manufacturing a display device, according to one or more embodiments of the disclosure.
Figure 9B:
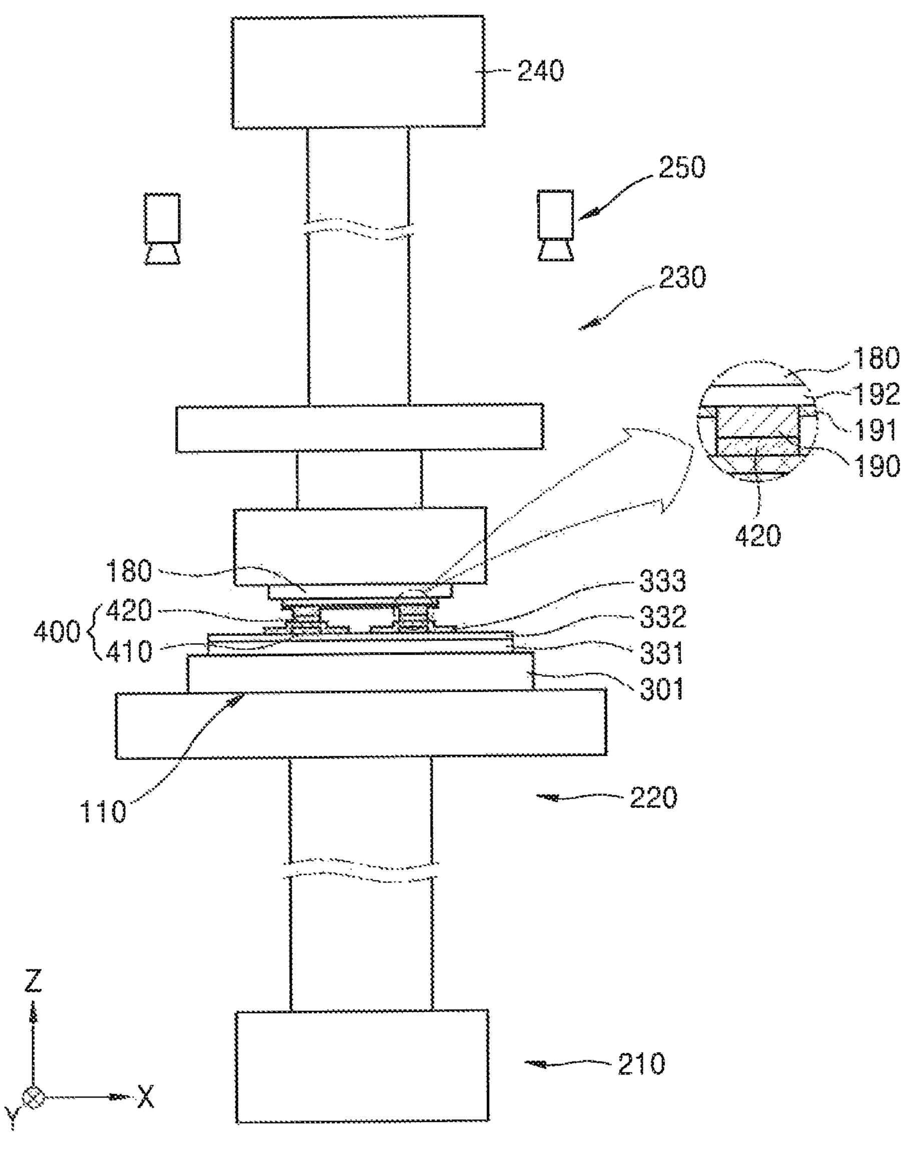

Referring to FIG. 9A, when the driving chip 180 is bonded to the display panel 110, the display panel 110 may be arranged on the first stage 220. In an embodiment of the disclosure, the driving chip 180 may be arranged on the display panel 110. In another embodiment of the disclosure, the driving chip 180 in a state of being attached to the bonding unit 230 may be transferred from the outside. In the following description, for convenience of explanation, a case in which the display panel 110 with the driving chip 180 provided thereon is arranged on the first stage 220 is mainly described.

When the driving chip 180 is arranged on the display panel 110, the driving chip 180 may be in contact with the second conductive layer 420. In this state, the driving chip 180 may be connected, through the circuit pattern 192, to the driving terminal 190 protruding from the terminal insulating film 191.

Referring to FIG. 98, after the display panel 110 is placed on the first stage 220, the driving chip 180 and the bonding unit 230 may come into contact with each other. In this state, by detecting a position between the display panel 110 and the driving chip 180 or the positions of the display panel 110 and the bonding unit 230, and the like, through the vision portion 250, the position of the display panel 110 and/or the position of the driving chip 180 may vary to correspond to a preset position based on the result of detection. When the bonding unit 230 is operated, the bonding unit 230 may apply vibration to the driving chip 180. Since the driving terminal 190 of the driving chip 180 and the second conductive layer 420 are in contact with each other to generate friction, at least one of the driving terminal 190 or the second conductive layer 420 may be fused so that the driving terminal 190 and the second conductive layer 420 may be bonded to each other.

Figure 9C:
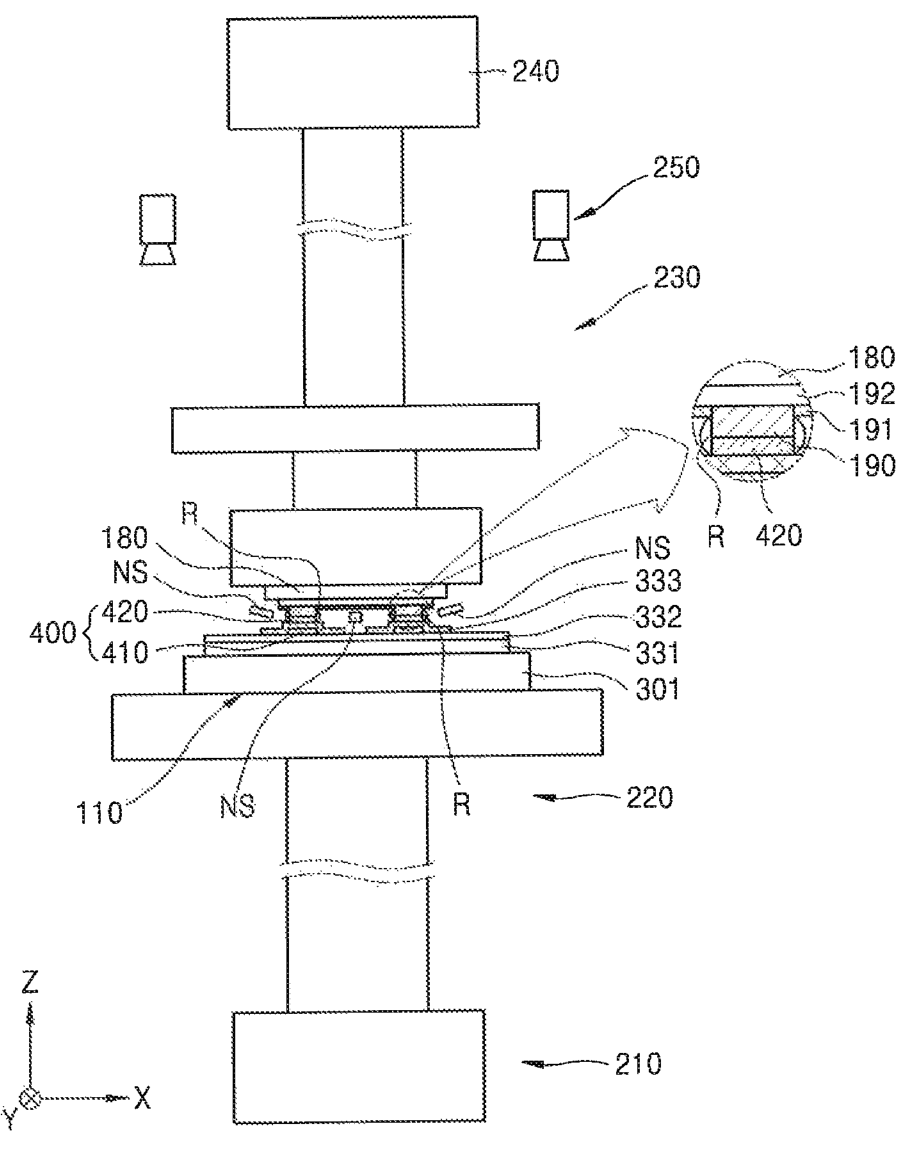

Referring to FIG. 9C, after the driving terminal 190 and the second conductive layer 420 are bonded to each other, resin R may be injected around the driving terminal 190 and the second conductive layer 420. For example, in a state in which the bonding unit 230 presses the driving chip 180, by injecting the resin R between the driving terminal 190 and the second conductive layer 420 through a nozzle NS or supplying the resin R from above the driving chip 180 after the bonding unit 230 is separated from the driving chip 180, the driving chip 180 may be completely surrounded. In this state, the shape of the resin R illustrated in FIG. 9C may correspond to the present embodiment, and the shape of the resin R is not limited to FIG. 9C and may have various shapes.

Figure 9D:
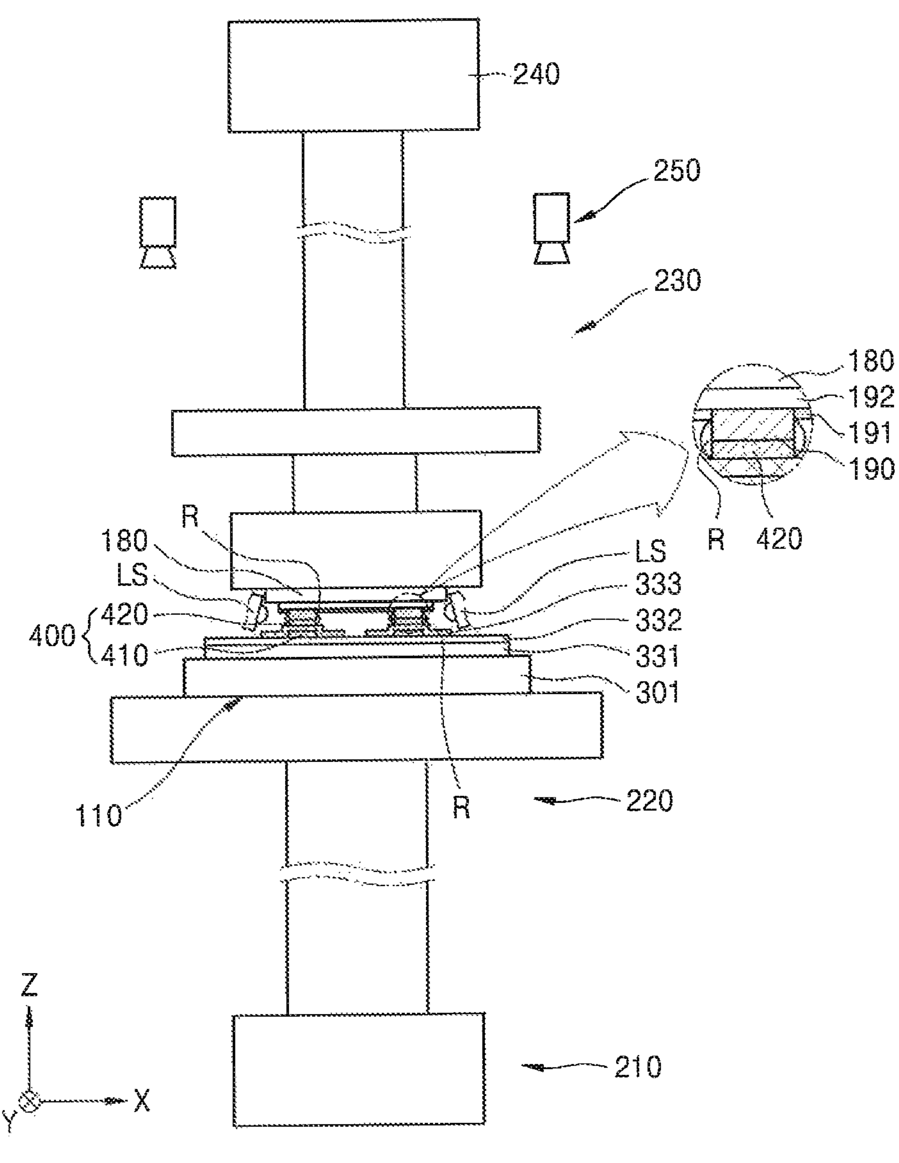

Referring to FIG. 9D, the resin R may be cured. In this state, the bonding unit 230 may be separated from the driving chip 180 to be apart from the driving chip 180 by a certain distance. The resin R may be cured by applying energy such as ultraviolet (UV), heat, and the like. For example, an ultraviolet lamp LS may supply ultraviolet to the resin R. In another embodiment of the disclosure, a heater may supply energy such as heat and the like to the resin R. In this state, the resin R may include a thermoplastic resin (e.g., styrene butadiene, polyvinyl butylene, and the like) that does not contain conductive balls, a thermosetting resin (e.g., epoxy resin, polyurethane, acryl resin, and the like), and/or a photocurable resin.

In the above case, the driving chip 180 may be fixedly bonded to the display panel 110. Furthermore, since the resin R is arranged to surround a portion where the driving terminal 190 and the second conductive layer 420 are bonded to each other, the deterioration of coupling of the driving terminal 190 and the second conductive layer 420 due to infiltration of moisture, oxygen, and the like into the portion where the driving terminal 190 and the second conductive layer 420 are bonded to each other may be reduced. In other words, the coupling strength of the driving terminal 190 and the second conductive layer 420 may be increased.

Figure 10:
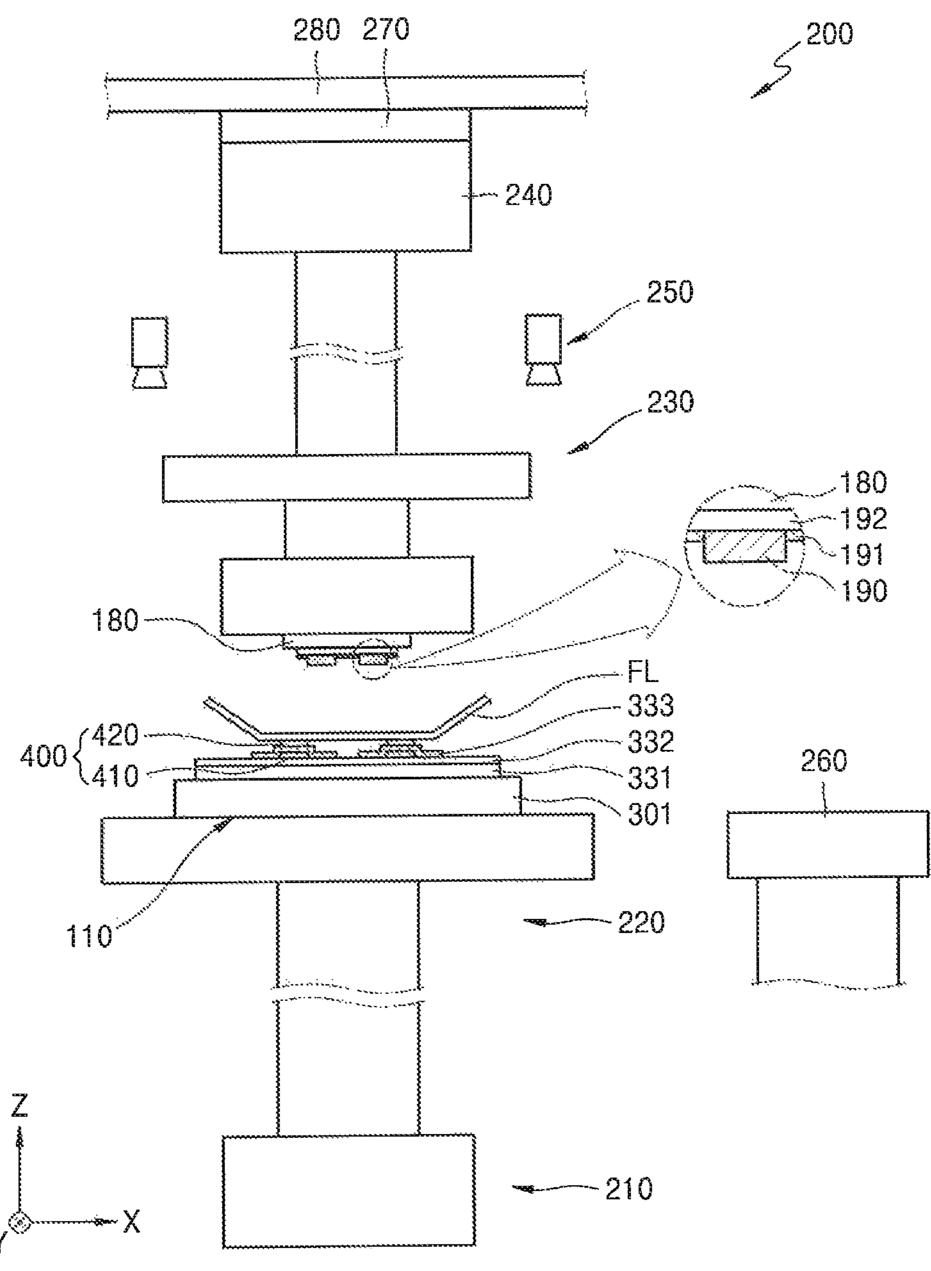
FIG. 10 is a front view of an apparatus for manufacturing a display device, according to one or more embodiments of the disclosure.

FIG. 10 is a front view of the apparatus 200 for manufacturing a display device, according to one or more embodiments of the disclosure.

Referring to FIG. 10, the apparatus 200 for manufacturing a display device may include the first linear driving portion 210, the first stage 220, the bonding unit 230, the second linear driving portion 240, a temperature detection portion, the vision portion 250, and a second stage 260. In this state, since the first linear driving portion 210, the first stage 220, the bonding unit 230, the second linear driving portion 240, the temperature detection portion, and the vision portion 250 are the same as or similar to those described in FIGS. 5 to 8, a detailed description thereof is omitted.

The second stage 260 may be arranged apart from the first stage 220, such that the driving chip 180 may be arranged on the second stage 260. In the above case, the bonding unit 230 may perform a linear motion in a first direction, for example, one of the X-axis direction and the Y-axis direction of FIG. 10) and/or a second direction, for example, the other of the X-axis direction and the Y-axis direction of FIG. 10. For example, the bonding unit 230 may be connected to the second linear driving portion 240, and the second linear driving portion 240 may be connected to a third linear driving portion 270. Furthermore, the third linear driving portion 270 may be connected to a fourth linear driving portion 280. In this state, the third linear driving portion 270 may move the second linear driving portion 240 in the first direction, and the fourth linear driving portion 280 may move the third linear driving portion 270 in the second direction. In this state, since the third linear driving portion 270 and the fourth linear driving portion 280 may have the shape that is the same as or similar to that of the first linear driving portion 210 of the FIG. 4, a detailed description thereof is omitted.

In the above case, the apparatus 200 for manufacturing a display device may be operated by arranging the display panel 110 on the first stage 220 and then the film member FL on the pad terminals 400 of the display panel 110.

The bonding unit 230 may be arranged on the second stage 260 through at least one of the fourth linear driving portion 280 and the third linear driving portion 270. Then, the driving chip 180 on the second stage 260 may be attached on a tip portion of the bonding unit 230 by operating the second linear driving portion 240.

Then, by operating at least one of the fourth linear driving portion 280 and the third linear driving portion 270, the bonding unit 230 may be arranged corresponding to the first stage 220. The vision portion 250 may detect the position of the display panel 110, and the first stage 220 may align the position of the display panel 110. In this state, instead of aligning the position of the display panel 110, the position of the bonding unit 230 may be moved to correspond to the position of the display panel 110.

As described above, when the positions of the display panel 110 and the bonding unit 230 are aligned to each other, the second linear driving portion 240 may be operated to bond the driving chip 180 to the display panel 110. In this state, the film member FL arranged between the display panel 110 and the driving chip 180 may be melted, and thus the pad terminals 400 and the driving terminals 190 may come to contact with each other to be bonded to each other due to friction therebetween.

In the above case, the heat applied to the tip portion of the bonding unit 230 may be prevented from being transferred to a vibration generation portion through the structure illustrated in FIGS. 5 to 7.

Accordingly, the method of manufacturing a display device according to one or more embodiments of the disclosure may be able to quickly and accurately bond the driving chip 180 to the display panel 110. Furthermore, the method of manufacturing a display device according to one or more embodiments of the disclosure may be capable of uniformly maintaining the frequency and/or amplitude of vibration of the tip portion by blocking the heat of the heater portion.

The above-described method of manufacturing a display device may be performed in a manner similar to that illustrated in FIGS. 9A to 9D.

For example, the display panel 110 may be arranged on the first stage 220, the driving chip 180 arranged on the second stage 260 is arranged on the display panel 110, and then the relative position between the display panel 110 and the driving chip 180 or the relative position between the display panel 110 and the bonding unit 230 may be detected through the vision portion 250. At least one of the positions of the display panel 110 and the bonding unit 230 may be adjusted such that the driving chip 180 may correspond to a position for attachment to the display panel 110, based on the relative position between the display panel 110 and the driving chip 180 or the relative position between the positions of the display panel 110 and the bonding unit 230. After the driving chip 180 is arranged on the display panel 110 to correspond to the position for attachment to the display panel 110, the bonding unit 230 may be operated.

When the bonding unit 230 is operated, the driving terminal 190 of the driving chip 180 may come to contact with the second conductive layer 420 and may be attached thereto. Then, resin may be arranged around the driving terminal 190 and the second conductive layer 420 through a nozzle. Then, the resin may be cured by an ultraviolet lamp or the like.

When the above process is completed, the display panel 110 on which the driving chip 180 is arranged may be drawn to the outside.

In another embodiment of the disclosure, the film member FL may be used instead of the resin. In this state, as described in FIG. 9D, the resin may include a resin that is curable by applying energy such as ultraviolet, heat, and the like. For example, the resin may include a thermoplastic resin (e.g., styrene butadiene, polyvinyl butylene, and the like) that does not contain conductive balls, a thermosetting resin (e.g., epoxy resin, polyurethane, acryl resin, and the like), and/or a photocurable resin. The resin may be arranged on the pad terminals 400 before the bonding of the driving terminals 190 and the pad terminals 400, not after the bonding of the driving terminals 190 and the pad terminals 400 as illustrated in FIGS. 9A to 9D. Then, when the driving terminals 190 are arranged as above and then vibrated by the bonding unit 230, the resin may be pushed to the edge sides of the driving terminals 190 and the pad terminals 400 from between the driving terminals 190 and the pad terminals 400, and after the bonding of the driving terminals 190 and the pad terminals 400 is completed, the resin may be arranged around the bonding portion of the driving terminals 190 and the pad terminals 400. The resin arranged around the bonding portion of the driving terminals 190 and the pad terminals 400 may be cured by applying heat, ultraviolet, and the like thereto.

The apparatus and method of manufacturing a display device according to one or more embodiments of the disclosure may firmly fix the driving chip and the display panel to each other.

The apparatus and method of manufacturing a display device according to one or more embodiments of the disclosure may prevent heat from being transferred toward the converter portion and simultaneously increase the life of the converter portion.

While one or more embodiments of the disclosure have been described with reference to the figures, it will be understood by those of ordinary skill in the art that various changes in form and details may be made thereto without departing from the spirit and scope of the disclosure as set forth by the following claims.

What is claimed is:

1. A method of manufacturing a display device, the method comprising:

arranging a display panel on a first stage;

arranging a head portion connected to a booster portion, such that a driving chip corresponds to a pad of the display panel;

bonding the driving chip to the pad of the display panel by applying heat to the head portion and vibrating the head portion;

blocking the heat of the head portion from moving toward the booster portion, by supplying a gas to the booster portion, wherein the gas is introduced into the booster portion and is moved through an inside of the booster portion and discharged to an outside of the booster portion; and moving the gas along an outer surface of the booster portion.

2. The method of claim 1, wherein the head portion is vibrated by a converter portion connected to the booster portion.

3. The method of claim 2, further comprising cooling an inside of the converter portion.

4. The method of claim 2, further comprising cooling the outside of the booster portion and an outside of the converter portion.

5. The method of claim 1, further comprising arranging a film member between the driving chip and the display panel.

6. The method of claim 1, further comprising cooling the booster portion.

7. The method of claim 1, further comprising heating the head portion.

8. A method of manufacturing a display device, the method comprising:

arranging a display panel on a first stage;

arranging a head portion connected to a booster portion, such that a driving chip corresponds to a pad of the display panel;

bonding the driving chip to the pad of the display panel by applying heat to the head portion and vibrating the head portion;

blocking the heat of the head portion from moving toward the booster portion, by supplying a gas to the booster portion, wherein the head portion is vibrated by a converter portion connected to the booster portion, wherein the gas is introduced into the booster portion and is moved through an inside of at least the booster portion, discharged to an outside of the booster portion, moved through an inside of the converter portion, and discharged to an outside of the converter portion; and moving the gas along an outer surface of the booster portion and an outer surface of the converter portion.

9. A method of manufacturing a display device, the method comprising:

arranging a display panel on a first stage;

arranging a head portion such that a driving chip corresponds to a pad of the display panel;

bonding the driving chip to the pad of the display panel by applying heat to the head portion and vibrating the head portion by using a converter portion connected to the head portion;

cooling the converter portion by supplying a gas to an inner surface of the converter portion; and surrounding an outer surface of the converter portion with a cooling pocket, wherein the gas is moved from an outer surface of the cooling pocket to the inner surface of the converter portion and moved along the inner surface of the converter portion in a first direction, and then from the inner surface of the converter portion to an outer surface of the converter portion and then moved along the outer surface of the converter portion within the cooling pocket in a second direction opposite the first direction and discharged out the cooling pocket.

10. The method of claim 9, wherein the converter portion is connected to the head portion via a booster portion.

11. The method of claim 10, further comprising cooling the booster portion by supplying the gas to the outer surface of the booster portion.

12. The method of claim 10, wherein the cooling pocket is in contact with a nodal point arranged at the booster portion or the converter portion.

13. The method of claim 9, further comprising heating the head portion through a heater portion arranged in the head portion.

14. The method of claim 9, further comprising fixing the driving chip on a tip portion protruding from the head portion.

15. The method of claim 9, further comprising arranging the driving chip on a second stage.

16. The method of claim 15, further comprising transferring the driving chip on the second stage to the head portion.

* * * * *